United States Patent
Bartos et al.

(10) Patent No.: US 9,482,725 B2
(45) Date of Patent: Nov. 1, 2016

(54) SENSOR DEVICE INCLUDING MAGNETORESISTIVE SENSOR ELEMENT AND PRE-MAGNETIZATION DEVICE

(75) Inventors: Axel Bartos, Waltrop (DE); Armin Meisenberg, Dortmund (DE); Reinhold Pieper, Lüdinghausen (DE)

(73) Assignee: MEAS Deutschland GmbH, Dortmund (DE)

( * ) Notice: Subject to any disclaimer, the term of this patent is extended or adjusted under 35 U.S.C. 154(b) by 276 days.

(21) Appl. No.: 14/239,002

(22) PCT Filed: Aug. 15, 2012

(86) PCT No.: PCT/EP2012/003469
§ 371 (c)(1),
(2), (4) Date: Jun. 6, 2014

(87) PCT Pub. No.: WO2013/023781
PCT Pub. Date: Feb. 21, 2013

(65) Prior Publication Data
US 2014/0312894 A1   Oct. 23, 2014

(30) Foreign Application Priority Data

Aug. 15, 2011 (DE) ......................... 10 2011 110 138

(51) Int. Cl.
*G01R 33/09* (2006.01)
*G07D 7/04* (2016.01)

(52) U.S. Cl.
CPC .............. *G01R 33/091* (2013.01); *G07D 7/04* (2013.01)

(58) Field of Classification Search
CPC ............................... G01R 33/091; G07D 7/04
USPC ........................................ 324/252; 338/32 R
See application file for complete search history.

(56) References Cited

U.S. PATENT DOCUMENTS 4,864,238 A   9/1989 Seitz
4,988,850 A   1/1991 Masuda et al.
(Continued)

FOREIGN PATENT DOCUMENTS

DE   1696245 A1   1/1972
DE   3738455 A1   6/1988
(Continued)

OTHER PUBLICATIONS

Dibbern, U., Part V: Magnetic Sensors Chapter 9: Magnetoresistive Sensors (pp. 341-380) in "Sensors Set: A Compreshensive Survey", (eds. Gopel, W., Hesse, J., and Zemel, J.N.), Wiley-VCH Verlag GmbH, Weinheim, Germany, 2008.
(Continued)

*Primary Examiner* — Jay Patidar
(74) *Attorney, Agent, or Firm* — Howard IP Law Group, P.C.

(57) ABSTRACT

A measuring device for measuring magnetic properties of the surroundings of the device includes at least one magnetoresistive element extending in a line direction, and a support field device generating a magnetic support field in an area over the line direction. A pre-magnetization device of one or more magnets are arranged at a distance from the sensor line in a direction vertical to the line direction and extending parallel to the line direction. The pre-magnetization device is arranged relative to the sensor line such that the fields of the pre-magnetization device and the support magnetic field overlap to provide an overlapping magnetic field with a field strength component pointing in the line direction that is greater at one location on the sensor line than the strength of a field component pointing vertically toward the line direction not in the direction of the height of the magnetoresistive element.

13 Claims, 12 Drawing Sheets

(56) References Cited

U.S. PATENT DOCUMENTS

Figure 1:
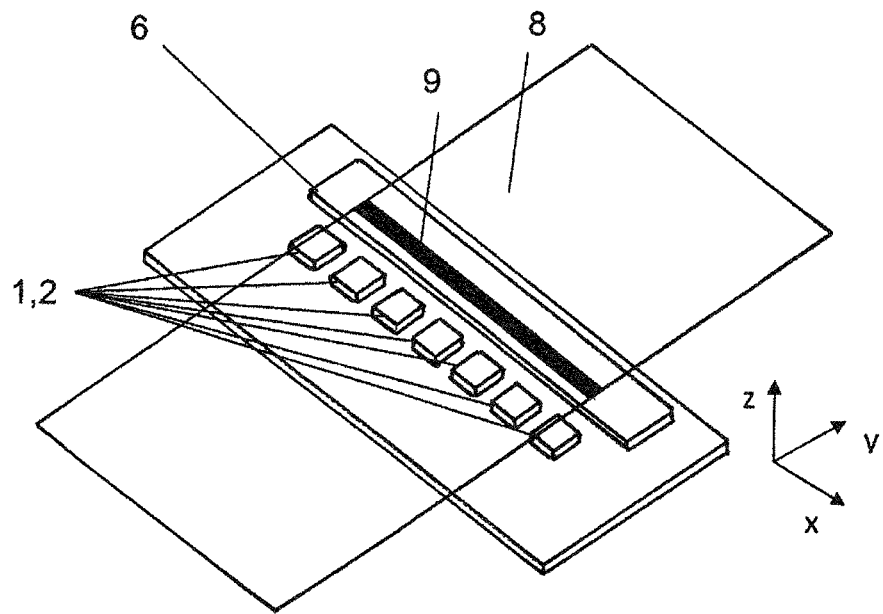

| | | |
|---|---|---|
| 4,996,677 A | 2/1991 | Naito et al. |
| 5,157,245 A | 10/1992 | Shigeno et al. |
| 5,180,903 A | 1/1993 | Shigeno et al. |
| 5,266,786 A | 11/1993 | Mazumder |
| 6,229,306 B1 | 5/2001 | Stein et al. |
| 7,157,905 B1 | 1/2007 | Minamitani et al. |
| 2008/0143328 A1 | 6/2008 | Thierauf et al. |
| 2011/0148408 A1 | 6/2011 | Meisenberg et al. |
| 2011/0233277 A1 | 9/2011 | Schutzmann et al. |
| 2013/0127457 A1* | 5/2013 | Musha .................. B82Y 25/00 324/252 |

FOREIGN PATENT DOCUMENTS

| | | |
|---|---|---|
| DE | 3916978 A1 | 12/1989 |
| DE | 3921420 A1 | 1/1990 |
| DE | 69006529 T2 | 6/1994 |
| DE | 3851078 T2 | 12/1994 |
| DE | 19625224 A1 | 1/1998 |
| DE | 69223721 T2 | 7/1998 |
| DE | 69608137 T2 | 1/2002 |
| DE | 102005008967 A1 | 8/2006 |
| DE | 10200833579 A1 | 1/2010 |
| DE | 102008061507 A1 | 6/2010 |
| EP | 0977015 A2 | 2/2000 |
| GB | 1127043 | 9/1968 |
| GB | 1362105 | 7/1974 |
| JP | H0285982 A | 3/1990 |
| JP | H0285379 A | 7/1990 |
| JP | H04364498 A | 12/1992 |
| JP | H06180304 A | 6/1994 |
| JP | H06180305 A | 6/1994 |
| JP | H11511883 A | 10/1999 |
| JP | 2000105847 A | 4/2000 |
| JP | 2002298186 A | 10/2002 |
| JP | 2004206316 A | 7/2004 |
| JP | 2007226674 A | 9/2007 |
| JP | 2007241653 A | 9/2007 |
| JP | 2008249370 A | 10/2008 |
| WO | 9723841 | 7/1997 |
| WO | 2005083457 A1 | 9/2005 |
| WO | 2010006801 A1 | 1/2010 |
| WO | 2010052797 A1 | 5/2010 |

OTHER PUBLICATIONS

International Search Report dated Sep. 30, 2013 for related PCT application PCT/EP2012/003469.

* cited by examiner

SENSOR DEVICE INCLUDING MAGNETORESISTIVE SENSOR ELEMENT AND PRE-MAGNETIZATION DEVICE

CROSS-REFERENCE TO RELATED APPLICATIONS

This application is a national stage application under 35 U.S.C. 371 of International Application PCT/EP2012/003469 filed Aug. 15, 2012, which claims priority to German Patent Application No. DE 102011110138.5 filed Aug. 15, 2011, which are incorporated by reference herein in their entireties.

The invention relates to a measuring device for measuring the magnetic properties of the surroundings of the measuring device.

A potential application of the invention is the testing of certificates or sheet, particularly bank notes, checks, or other sheets of paper for the presence of magnetic features, particularly to check whether the certificates or sheets have special previously applied magnetic features.

The quantity of the magnetic material used on a document of value is normally small. The magnetic stray field of the security thread is therefore only a few A/m at a distance of a few mm from the security thread. Very sensitive sensors are needed to verify such types of low magnetic stray fields. The measuring devices used in practice therefore require a distance that is no more than 1 mm between the document of value and the sensor. In addition, only a few technologies are suitable for identifying such types of weak, locally limited stray fields. The use of differential planar coils (DE 37 38 455 A1), magnetoresistive sensor elements (GB 1 362 105), and technologies, inter alia, which are used for read heads or field plates, are known DE 39 21 420 A1 for example. The sensors used in the measuring devices used in the industry are often designed as multi-channel lines (DE 38 51 078 T2, DE 39 16 978 A1 and DE 690 06 529 T2) or as magnetoresistive sensors (DE 692 23 721 T2).

Documents of value can have soft magnetic security features and/or hard magnetic security features. Hard magnetic security features may be produced from materials with high remanence and high coercive field strength. Soft magnetic security features may be produced from materials with high remanence but low coercive field strength. Permanent magnets in particular are produced from hard magnetic materials. Soft magnetic materials are ferromagnetic materials that are easy to magnetize in a magnetic field. The associated magnetic polarization (magnetization) may be generated, for example by means of an electric current in a current-carrying coil or through the presence of a permanent magnet. Polarization generated in this manner leads to a much higher magnetic flux density in the soft magnetic material than is generated in the air by the externally acting magnetic field. Soft magnetic materials generally have a coercive field strength of less than 1000 A/m. Soft magnetic materials may well have saturation magnetization values that are comparable to hard magnetic materials, however, which means that they cannot be differentiated from hard magnetic materials in the saturated condition.

Therefore, in order to verify soft magnetic security features in a document of value, there must be an external magnetic field present that will saturate the soft magnetic substances to the extent possible. Large magnets are installed in known measuring devices in the industry that generate a sufficiently strong field for magnetizing the soft and hard magnetic security features, but that also make the setting up of such types of measuring devices complicated.

DE 696 08 137 T2 discloses the provision of a read head that has a magnetization agent and at least one magnetoresistive element in which the magnetoresistive element has a variable resistor, which depends on the magnetic flux attached to it. The read head described therein is used such that each document of value to be detected during the relative movement of the document of value to the read head is first passed in front of the magnetization agent and then in front of said magnetoresistive element, wherein the magnetization agent can be designed such that a continuous magnetic flux is present at the sensor element.

Hard magnetic security features have a magnetic field themselves without needing an external magnetic field, provided the hard magnetic materials have been completely magnetized beforehand. This magnetic field also remains for a longer period of time. Over time, statistical processes occur that can demagnetize the hard magnetic materials. For example, when handled, bank notes are often impacted or creased. This can cause demagnetization of the hard magnetic materials. Therefore, to measure hard magnetic security features, it is helpful to imprint a new (obvious and permanent) magnetization feature onto the hard magnetic security feature using a pre-magnetization magnet. This newly applied magnetization can then retain the hard magnetic security feature over a longer timeframe, at least over the timeframe of the measurement.

A special security feature on bank notes is the ferromagnetic security thread (see DE 16 96 245 A1). In the industry, ferromagnetic materials that have a small coercive field strength and a large coercive field strength are used to produce the security thread. In a preferred embodiment, measuring devices to test such types of bank notes are therefore designed to detect both security threads made of material with low coercive field strength and security threads made of material with high coercive field strength.

WO 2010/006801 A1 discloses a measuring device for measuring the magnetic properties of the surroundings of the measuring device having a sensor line comprising at least two magnetoresistive sensor elements arranged in a line extending in a line direction and one support field device, which generates a magnetic support field, which has a magnetic field component pointing in a line direction and whose field strength in the line direction varies, wherein said field strength pattern has no zero-crossing and/or no maximum or minimum in the line direction on at least two sensor edges, arranged in succession in the line direction, of the sensor elements forming the sensor line. With the measuring device described therein, in a preferred embodiment, a pre-magnetizing magnet may be provided that is arranged in front of the sensor line. This pre-magnetizing magnet can be used to magnetize a measurement object with a hard magnetic pattern by means of which the measurement object is initially moved. If the measurement object is then moved via a sensor line, said sensor line can then detect the hard magnetic pattern.

In a preferred embodiment, the measuring device known from WO 2010/006801 A1 may have two sensor lines arranged one after the other in the read direction of the objects to be measured, and the sensor lines are used to determine the different features. One assumes in that case that a pre-magnetization of the bank note is necessary for detecting the magnetic pattern, and while the sensor line detecting the hard magnetic pattern cannot have any pre-magnetization field during the measurement, a strong pre-magnetization field is required for the sensor line at the site of the measurement to detect the soft magnetic pattern. With the embodiment described therein, hard magnetic and soft magnetic patterns can be detected in that the pre-magnetization field is effective in the area of a first sensor line and the magnetic features are practically completely magnetized thereby enabling detection of the soft and hard magnetic patterns and simultaneously serving to pre-magnetize the hard magnetic structures. If the bank note is subsequently routed above a second sensor line in an area in which the pre-magnetization field is no longer effective, this second sensor line can separately detect the purely hard magnetic pattern.

Against this backdrop, the object of the invention was to propose a measuring device for measuring the magnetic properties of the surroundings of the measuring device that would no longer have at least one disadvantage in the known measuring devices or measuring method from the prior art.

This object is achieved by the embodiments described in the following description.

The invention is based on the idea of using one or more of the magnetoresistive sensor elements forming the sensor line, which sensor elements essentially can only measure the magnetic properties of surroundings thereof in one direction, characterized as the measuring direction, of an orthogonal coordinate system or in one plane, characterized as the sensor measuring plane, spanned by two vertical measuring directions of an orthogonal coordinate system. Sensor elements designed as a chip that are based on a magnetoresistive effect can be designed such that they detect the magnetic field components in one measuring direction in the chip plane. Such sensor elements designed as a chip and based on a magnetoresistive effect can thus only or essentially determine whether the field strength of a single field component, lying within the chip plane, of the magnetic field acting upon the sensor element has changed. This can be achieved, for example, through a so-called barber-pole design, as described, for example, in Dibbern, U. (2008) Magnetoresistive Sensors, in Sensors Set: A Comprehensive Survey (eds. W. Göpel, J. Hesse, and J. N. Zemel), Wiley-VCH Verlag GmbH, Weinheim, Germany. If multiple sensor elements are arranged in one line direction, the sensor elements can be designed such that the measuring direction is oriented vertically with respect to the line direction. Magnetoresistive sensors that are produced using planar thin-film technology are practically non-sensitive to the field components vertical to the chip plane, particularly to changes in the field strength of the field component vertical to the chip plane of the magnetic field affecting the chip.

With such types of sensor elements, the invention proposes that:

in the case of a pre-magnetization device only composed of one pre-magnetization magnet, the properties of the pre-magnetization magnet influencing the magnetic field generated thereby, and the arrangement of said pre-magnetization magnet relative to the sensor line, as well as the support field generated by the support field device are selected such that an overlapping magnetic field results from the overlapping of the magnetic field and the support field generated by the pre-magnetization device whose strength in the field component pointing in the line direction is greater, at least at one location on the sensor line, than the strength of the field component pointing vertically toward the line direction and not in the direction of the height of the sensor element; or in the case of a pre-magnetization device composed of multiple pre-magnetization magnets, the properties of the pre-magnetization magnets influencing the magnetic field generated thereby, and said arrangement of the pre-magnetization magnets relative to the sensor line, as well as the support field generated by the support field device are selected such that an overlapping magnetic field results from the overlapping of the magnetic field and the support field generated by the pre-magnetization device whose strength of the field component pointing in the line direction is greater, at least at one location on the sensor line, than the strength of the field component pointing vertically toward the line direction and not in the direction of the height of the sensor element.

The overlapping magnetic field is understood to be the field affecting the sensor line even if no measurable actions have been taken that affect the magnetic properties of the surroundings of the sensor line such as, for example, the passing of a bank note along the sensor line. The overlapping magnetic field is, accordingly, the magnetic field permanently acting on the sensor line that results from the overlapping from the pre-magnetization magnetic field generated by the pre-magnetization device and the magnetic field resulting from the support field generated by the support field device. The overlapping magnetic field is invariant with respect to time in a preferred embodiment.

According to the invention, the proposed selection of the overlapping magnetic field would mean that the pre-magnetization magnetic field would not negatively influence the effect of the support field on the sensor line.

The measuring device according to the invention has a pre-magnetization device in which at least one pre-magnetization magnet is arranged at a distance from the sensor line in a direction that is vertical to the line direction, and that extends in a direction that is parallel to the line direction. It is hereby understood that the line linking the north pole and south pole of the pre-magnetization magnet is oriented vertically with respect to the line direction, and the pre-magnetization magnet generates a magnetic field that points essentially in the direction of the height of the sensor element. The z direction is meant in this case.

According to the invention, the claim is that an overlapping magnetic field is generated, whose strength of the field component pointing in the line direction is greater, at least at one location on the sensor line, than the strength of the field component pointing vertically toward the line direction and not in the direction of the height of the sensor element. In this case, the term "strength" is particularly understood to mean the amount of the field component regardless of whether the field component is pointing in the positive direction of the field component or in the negative direction of the field component.

Both in the case of one pre-magnetization magnet and in the case of multiple pre-magnetization magnets, it may in particular be provided that the strength of the field component of the overlapping magnetic field resulting from the overlapping (from the overlapping of the magnetic field generated by the pre-magnetization device and from the support field) be less, at least at one location on the sensor line, than the strength of the field component pointing in the direction of the height of the sensor element. Thus, it may happen that the properties of the pre-magnetization magnet or pre-magnetization magnets, influencing the magnetic field generated thereby, and the arrangement of said pre-magnetization magnet or magnets relative to the sensor line as well as the support field generated by the support field device are selected such that an overlapping magnetic field results from the overlapping of the magnetic field and the support field generated by the pre-magnetization device, whose strength in the field component pointing in the line direction is greater, at least at one location on the sensor line, than the strength of the field component affecting the line direction vertically and not pointing in the direction of the height of the sensor element, and the strength of the field component pointing in the line direction is less, at least in one location on the sensor line, than the strength of the field component pointing in the direction of the height of the sensor element. In particular, it may be intended for the pre-magnetization device and the support field device to be arranged spatially separated from one another.

It may be possible for the field components to be functionally "separated." The support field for the sensor elements can be oriented in the line direction. The measurement field can be aligned in the direction of movement of the object to be measured (for example the bank note or sheet), i.e. vertical to the line direction but not in the direction of extension at the height of the sensor elements. The pre-magnetization can be oriented at the height of the sensor elements. It is preferable in this case that the field component in the line direction be small, wherein the field component in the direction of movement can be practically negligible without an object and, in the presence of an object, will depend on the object, and it is particularly preferable that the field component be selected to be very large in the direction of the height of the sensor element.

In a preferred embodiment, the sensor element or elements forming the sensor line are arranged and designed such that they can only measure the magnetic properties of the surroundings in the line direction or, with sensor elements that can essentially only measure the magnetic properties of the surroundings in one plane, characterized as the sensor measuring plane, spanned by two vertical measuring directions of an orthogonal coordinate system, when the line direction is one of these measuring directions.

In an alternative, but likewise preferred embodiment, the sensor element or elements forming the sensor line are arranged and designed such that they can essentially only measure the magnetic properties of the surroundings in one line direction vertical to the line direction. As previously stated, it is possible to arrange multiple sensor elements designed as a chip and based on a magnetoresistive effect in one line direction, which means that the sensor elements are designed such that the sensitive measuring direction is oriented vertically to the line direction (and in doing so is not in the direction of the height of the sensor element).

In a preferred embodiment, the strength of the field component, pointing in the line direction, of the overlapping magnetic field is greater than the strength of the field component, pointing vertically to the line direction and not in the direction of the height of the sensor element, of the overlapping magnetic field on at least 50% of the sites, or particularly preferably at least 60%, and especially preferably on at least 70% of the sites of the sensor line.

In a preferred embodiment, the strength of the field component, pointing in the line direction, of the overlapping magnetic field is less than the strength of the field component, pointing vertically to the line direction and in the direction of the height of the sensor element, of the overlapping magnetic field, by a factor of 10, or particularly preferably by a factor of 100, at the stated sites.

With such type of design in the pre-magnetization device, the advantage can be achieved in that the support field, generated by the support field device, is limited in the measuring direction or in the sensor measuring plane, to which the measuring of the magnetic properties by the sensor element is limited, can be generated by the pre-magnetization device undisturbed by overlapping from another magnetic field. This aspect of the invention has the particular advantage that the desired magnetization of the object from the pre-magnetization magnet that is intended to influence the magnetic properties of the surroundings of the measuring device in order that these properties can be measured by the measuring device can take place without influencing the measuring properties of the sensor element significantly.

The measuring device according to the invention has the advantage that the measures necessary for pre-magnetizing the hard magnetic materials and the measures necessary for detecting soft magnetic materials can be separated from the support field distribution required for sensor operation. The pre-magnetization magnet can, at any rate, magnetize the hard magnetic materials as a first magnetic function group and—if desired—magnetize the soft magnetic materials during their measurement. The support field device, as a second magnetic functional group, can provide distribution of the support field/magnetic field component, pointing in the line direction, which enables the most sensitive and complete verification of the magnetic security features.

The measuring device according to the invention offers the additional advantage that the support field device can be designed, particularly preferably, with one or more support field magnets that are small enough such that the support field device fulfills only the function of providing distribution of the support field/magnetic field component pointing in the line direction that enable the most sensitive and complete verification of magnetic security features. Attempts have been made to design the support field device such that the support field generated by it was also capable of magnetizing soft magnetic materials during the measurement. To do this, it is necessary to use a support field device with at least one support field magnet in which the magnetic field generated by it unleashes an effect not only in the area of the sensor elements but also in the area in which the measurement object to be tested is located or through which the measurement object to be tested will be moved. In particular, a support field magnet must be used whose magnetic field will be unleashed in the area in which the measurement object to be tested is located or through which the measurement object to be tested will be moved that will be sufficient for magnetizing soft magnetic materials during their measurement. It has been shown that relatively large support field magnets must be used for this. Because the measuring device according to the invention will then enable the support field device to be designed such that it solely fulfills the function of providing distribution of the support field/magnetic field component, pointing in the line direction, which will enable the most sensitive and complete verification of magnetic security features, the support field device can be designed to be especially compact.

In an especially preferred embodiment, the initially non-magnetized support field magnets are soldered with the sensors on a carrier plate in a joint work step. It is preferable that the support field magnets be magnetized after soldering.

In a preferred embodiment with a pre-magnetization device consisting of one pre-magnetization magnet, the properties, influencing the magnetic field created by it, of the pre-magnetization magnet and the arrangement thereof relative to the sensor line are selected such that, at no point of a sensor element of the sensor line, is the field strength of the magnetic field generated by the pre-magnetization magnet greater, in any of the three directions, but at least particularly in any of two directions of an orthogonal coordinate system, than the field strength of the magnetic field generated by the support field device in the respectively corresponding direction of the orthogonal coordinate system, provided the line direction is considered. In a preferred embodiment with a pre-magnetization device consisting of multiple pre-magnetization magnets, the properties, influencing the magnetic field created by them, of the pre-magnetization magnets and the arrangement of the pre-magnetization magnets relative to the sensor line are selected such that, at no point of a sensor element of the sensor line, is the field strength of the magnetic field generated by the individually generated magnetic fields from the overlapping of the pre-magnetization magnets greater, in any of the three directions, but at least particularly in any of two directions of an orthogonal coordinate system, than the field strength of the magnetic field generated by the support field device in the measuring direction, provided the line direction is considered.

With a measuring device according to the invention, a sensor line with at least one magnetoresistive sensor element extending in one line direction is provided that can measure the magnetic properties in its surroundings. The sensor element for measuring the magnetic properties in its surroundings may be designed such that it has the "anisotripic" magnetoresistive effect (AMR effect) or the "giant" magnetoresistive effect (GMR effect). The sensor element can, however, also have other effects such as, for example, the giant magnetoimpedance (GMI), the tunnel magnetoresistance effect (TMR), or the hall effect.

A sensor element particularly preferably has four or more individual bridge resistors connected together to form one Wheatstone bridge or two or more individual bridge resistors connected together to form a Wheatstone half-bridge.

The sensor element has a width and a length as well as a height, wherein the height is less than the width, and the height is less than the length, and the line direction points in the direction of the width or in the direction of the length of the sensor element.

In a preferred embodiment, the sensor element has resistors, wherein the entire space taken up by the resistors has a width and a length and a height, wherein the height is less than the width, and the height is less than the length, and the line direction points in the direction of the width or in the direction of the length of the sensor element. It is conceivable for the sensor elements with resistors to be equipped with additional components as a part of the sensor element such as, for example, electric lines for applying voltage to the resistors or for measuring voltage. These lines can lead in the direction of the height and mean that the sensor element can reach a relatively large height that can also match that of the width. With such designs, it is preferable when at least the space that is taken up by the resistors fulfills the specified rule of interpretation.

It is also possible for the sensor elements to be arranged in groups, i.e. for multiple elements to be arranged in a line or to have a line-shaped group to form the sensor line. An arrangement or group of sensor elements can be placed in a housing. Adjacent sensor elements in a group or in a housing will be equidistant from one another. The housings to form the line may be, in particular, in intervals with respect to one another such that the adjacent sensor elements of housings or groups that are adjacent to one another to form a line have the same distance as the distance between the sensor elements in one housing to one another.

The advantages of the invention can be achieved with a magnetoresistive sensor element that extends in one line direction. In doing so, with a sensor element having four or more individual bridge resistors connected together to form a Wheatstone bridge extending in one line direction, the extension in one line direction is understood to be at least two of these individual resistors being arranged next to one another in the line direction. It is especially preferable that the sensor line have at least two magnetoresistive sensor elements, however, which are arranged one after the other in the line direction. The length of the sensor line and thus the number of the magnetoresistive sensor elements used depends on the measurement to be taken. To measure euro bank notes, a sensor line may have, for example, more than 10, or particularly preferably more than 20, for example more than 31, and preferably 90 sensor elements, especially if the device is being used to measure euro bank notes that are being moved with their short side in a measuring direction relative to the measuring device.

To form the sensor line, the sensor elements—if present—are arranged in a line. It is particularly preferable that the sensor elements be on one line. It is also conceivable for the sensor elements of an individual line to be arranged differently in relation to an axis pointing in a line direction, which means that the central longitudinal axes of the individual sensors are no longer all lying on one line. It is particularly preferable that such types of positioned sensor elements be arranged such that they partially overlap when viewed in the direction of the line direction, however.

In a preferred embodiment, multiple sensor elements are combined in one component, for example arranged on a common carrier structure. Such type of component is referred to as a sensor in the following. A sensor can, for example, have two, three, four, or more sensor elements. It is also possible, however, for a sensor to be formed by a single sensor element.

The measuring device according to the invention is suitable for measuring the magnetic properties of the surroundings of the measuring device. The magnetic properties of the surroundings of the measuring device can be understood to mean, in particular, the magnetic field strength of a magnetic field in the surroundings of the measuring device, the field direction of a magnetic field in the surroundings of the measuring device, but also, for example, the change in the field strength or field direction of the magnetic field in the surroundings of the measuring device. For example, the change in the field strength and the field direction of the magnetic field surrounding the measuring device is understood to be a magnetic property of the surroundings when said field is changed due to overlapping of a field, which is generated by a magnetic pattern of a bank note. In a preferred embodiment, the sensor line is designed such that it only detects spatial and/or chronological changes in the magnetic properties of the surroundings of the measuring device.

In a preferred embodiment, the sensor element is designed such that it can only measure the magnetic properties of the surroundings of the measuring device, which, according to the definition, also includes the change in a field strength, in the direction of an orthogonal coordinate system designated as the measuring direction or, in an alternative embodiment, can only measure in two directions of an orthogonal coordinate system that lie in a plane characterized as the sensor measuring plane.

In a preferred embodiment, the measuring device according to the invention for measuring magnetic structures of a certificate or a sheet, particularly a bank note or check, is designed and has suitable means of moving the certificate or sheet, at least in an area adjacent to the sensor line, in a measuring plane past the sensor line. In doing so, the direction into which the certificate or the sheet is moved is designated as the read direction. It is particularly preferable when the sensor element is designed such that the measuring direction corresponds to the read direction meaning that the sensor element can only or mainly measure magnetic properties of its surroundings in the read direction.

The support field device used according to the invention and the pre-magnetization magnet may consist of one or multiple components, for example permanent magnets. It is particularly preferable when the support field device according to the invention is formed from a single magnet with locally varying magnetization distribution, with a pole strip being particularly preferred. In a preferred embodiment, the support field device and/or the pre-magnetization magnet have permanent magnets. The pre-magnetization magnet and/or the support field device can, however, also have electric coils that generate the desired magnetic field.

In a preferred embodiment, the sensor elements are arranged equidistant apart in the line direction. In a particularly preferred embodiment, the distance between a first sensor element and a neighboring sensor element, in relation to the distance between the centers of the two sensor elements, is between 1 and 10 mm, or preferably between 2 and 5 mm, and particularly preferably 3.5 mm. In a particularly preferred embodiment, a chip has two sensor elements arranged one after the other in the line direction and has a length—without the housing—of from 1.5 to 9 mm, or preferably of from 2 to 3 mm, and especially preferably of 2.5 mm in the line direction. In a preferred embodiment, the distance from the edge of one chip to the edge of the neighboring chip is less than 1.5 mm and particularly preferably less than 1.1 mm.

In an alternative embodiment, the sensor elements are arranged such that the distance between two edges of two neighboring sensor elements that are positioned on a chip is less than the distance between two edges of adjacent sensor elements that are not positioned on a chip. The distance between two chips is normally dictated by the technology that can be used to connect a chip to a carrier plate. These technologies generally require more space than the space that is required to position two magnetoresistive sensor elements on a chip. The sensitivity of the measuring device can therefore be increased by placing the sensor elements on the chip and placing the chips on the board as close as the particular technology used will allow.

The production of the sensor elements on the chips is preferably done using planar technology, semiconductor technology, or microsystem technology methods.

In a preferred embodiment, recesses are incorporated in a printed circuit board to accommodate the pre-magnetization magnet, with this especially preferably being done through milling. This enables the use of larger magnets while maintaining the same amount of remaining installation space thus enabling an increase in the field strength at the site of the document of value and/or the sensor line.

An improvement in the measuring accuracy will be achieved if the field strength pattern in the line direction has no zero-crossing and/or no maximum or minimum on at least two sensor edges arranged in succession in the line direction. In doing so, these sensor edges arranged in succession in the line direction do not have to follow one another directly. Advantages are also achieved when the field strength pattern in the line direction has no zero-crossing and/or no maximum or minimum at any preferred edge of any first sensor element in the sensor line and at any preferred edge of any second sensor element in a sensor line, as long as these are edges that are arranged in succession in the line direction over the entire expansion of the sensor line.

With an embodiment of the measuring device according to the invention, it is possible for the field strength pattern in the line direction to have a zero-crossing and/or a maximum or minimum at a sensor edge of the sensor elements forming the sensor line. Advantages in relation to the measuring accuracy can then also be achieved at other sensor element edges. In an especially preferred embodiment of the measuring device according to the invention, a support field is generated with which the field strength pattern in the line direction has no zero-crossing and/or no maximum or minimum at any of the sensor edges, arranged in succession in the line direction, of the sensor elements forming the sensor line. For example, the support field is generated by one magnet per sensor element. In the simplest case, this magnet can be placed directly on the sensor during production of the sensor element.

The support field can be time-variable, for example influenced by impulses. In a preferred embodiment, the support field, however, is time-invariable and always lies in the same way. This simplifies the setup of the measuring device, in particular, because permanent magnets can be used to generate the support field.

In a preferred embodiment, the field strength pattern in the line direction is periodical and has, in an especially preferred embodiment, an integer multiple or an integer fraction of the preferably uniform distance between the sensor elements of the sensor line as the period (the distance here is understood to be the distance between the centers of two adjacent sensor elements). In an especially preferred embodiment, the support field device has arrangements of magnets at the start and end of the sensor line that also lead to an essentially periodical pattern in the field strength in the line direction above the sensor line at the ends of the line. This can be achieved by the magnet arrangement having preferably at least 3 additional poles extending beyond the end of the sensor line. In a preferred embodiment, the edge effects are reduced by means of a modification in the geometry or magnetization or arrangement of the external magnets, for example by extending the length of the external magnet at the respective end of the sensor line by approximately 30% of the magnetic period in order to reduce the overall length.

In a preferred embodiment, the support field device has a line of magnets arranged next to one another, particularly in the direction of the sensor elements. The magnetization of the magnets in this line can be alternating, which means that the magnetization of a magnet is opposite the magnetization of the magnet adjacent thereto. The magnets arranged next to each other in a line may, however, also have the same magnetization. In this case, the magnets are especially preferably arranged some distance from one another in the line direction. The magnets arranged next to one another in a line may, however, also have alternating magnetization that will strengthen the field on the side of the sensor elements and weaken the field on the back side.

In a preferred embodiment, particularly with magnets arranged next to one another in the line direction (behind one another) in which the magnetization of the magnets alternates from one to the neighboring magnet, the magnets are arranged directly next to one another contiguously. This leads to a homogenous pattern in the support field. In a preferred embodiment, the measuring device may contain a mechanism for generating a time-varying, non-homogenous magnetic field. Alternatively, the measuring device may contain a mechanism for generating a time-varying, homogenous magnetic field.

The support field device may be produced, in particular, from plastic-bonded hard ferrite or rare-earth magnets that are injection-molded or pressed or are from sintered rare-earth magnets or other permanent magnet materials. The support field device may have an arrangement of permanent-magnetic magnets that are placed on a carrier plate in a de-magnetized condition and then jointly magnetized subsequently.

In a preferred embodiment, the support field device with a line of magnets arranged next to one another, with which the magnetization alternates, is arranged in a relationship with respect to the sensor line such that the transition from one magnet to a neighboring magnet is arranged in the center of at least one sensor element, in relation to its expansion in the line direction. This ensures, in a simple manner, that the field strength pattern in the line direction has no zero-crossing and/or no maximum or minimum at the sensor edges, arranged in succession, of the sensor elements forming the sensor line.

The measuring device according to the invention has a pre-magnetization magnet that is arranged at a distance from the sensor line in a direction that is vertical to the line direction and that extends in a direction that is parallel to the line direction. In doing so, it may be sufficient to have only one single pre-magnetization magnet to achieve the advantages according to the invention. It is especially preferable that the extension of the pre-magnetization magnet in the direction parallel to the line direction of the sensor line match the length of the sensor line. It is particularly preferable that the pre-magnetization magnet be somewhat longer in a direction parallel to the line direction than the length of sensor line in the line direction. This can be achieved by a single magnet that is suitably molded. In a preferred embodiment, multiple pre-magnetization magnets are used that are arranged adjacent to one another in a direction parallel to the line direction of the sensor line.

In an especially preferred embodiment, the measuring device is designed for detecting the magnetic structures of a certificate or a sheet, particularly a bank note, and has suitable means of moving the certificate or sheet, at least in an area adjacent to the sensor line, in a measuring plane past the sensor line. The measuring plane is the plane containing the certificate or sheet when it is tested. The sensor measuring plane, on the other hand, is the plane in which a correspondingly designed magnetoresistive sensor element can measure the properties of its surroundings. The sensor measuring plane is the plane in which the elements of the sensor element effective for the measurements are located, and which measure the properties of the magnetic field affecting said elements. The measuring plane is located some distance away from the sensor measuring plane. The movement of the measurement object to be tested through the measuring plane, however, causes a change in the magnetic field affecting the sensor elements in the sensor measuring plane. Monitoring of the change in the properties of the magnetic field affecting the sensor element in the sensor measuring plane thus enables conclusions to be made about the conditions, for example the magnetic material or material that can be magnetized passing through the measuring plane. Mechanisms suitable for moving the certificate or sheet include, in particular, rollers that form a roller gap in which the certificate or sheet can be held. If two groups of such rollers are used and the roller gaps formed between the rollers of the respective group are aligned accordingly with respect one another, a certificate or a sheet can be moved between the two groups of rollers in a plane in front of the sensor line. Likewise, the certificate or sheet can be moved on a conveyor belt, for example on a conveyor belt having a rubber surface or a conveyor belt consisting of non-woven fabric, past the sensor line.

In a preferred embodiment, the measuring device has a mechanism for moving the certificate or sheet in a measuring plane at least in one area adjacent to the sensor line, past the sensor line. In this preferred embodiment, the properties of the pre-magnetization magnet influencing the magnetic field created by it and its arrangement relative to the sensor line are selected such that the field strength of the magnetic field generated by the pre-magnetization magnet is greater in all directions of an orthogonal coordinate system at the site of the measuring plane than at one site of the sensor line. For the embodiments with which a sensor element is used, which can essentially only measure the magnetic properties of its surroundings in a plane designated as the sensor measuring plane, in this preferred embodiment, the field strength of the magnetic field generated by the pre-magnetization magnet can be greater in all directions of an orthogonal coordinate system at the site of the measuring plane than at one site of the sensor measuring plane.

In an especially preferred embodiment, the pre-magnetization magnet forms a first pre-magnetization magnet, wherein a second pre-magnetization magnet is provided that is arranged some distance from the sensor line in a direction that is opposite the direction in which the first pre-magnetization magnet is arranged some distance away from the sensor line. This enables detection that is independent of the read direction of a certificate or sheet moving relative to the measuring direction. In addition, the influence of pre-magnetization on the support field can be reduced by such type of embodiment.

In a preferred embodiment, the sensor line, the pre-magnetization device, and the support field device are integrated into one housing. It is especially preferable that the sensor line, the pre-magnetization device, and the support field device be integrated on one printed circuit board. The pre-magnetization device and/or the support field device may also, however, be a component of the housing. In a preferred embodiment, the housing has a device for affixing a protective sheet to protect the sensor line and/or the pre-magnetization device from wear.

In a preferred embodiment, the sensor line has at least two sensor elements. Each of the sensor elements has at least one signal line that the sensor element uses to emit a sensor signal. In this preferred embodiment, at least one multiplexer is provided to which the signal lines of the sensor elements are routed. The multiplexer processes the sensor signals of the signal lines such that a single signal can be provided to an output line of the multiplexer that was generated based on the sensor signals of the signal lines. In a preferred embodiment, a plurality of multiplexers are provided, wherein the signal lines of a first group of sensor elements are routed to the first multiplexer and the signal lines of a second group of sensor elements are routed to a second multiplexer.

According to another, independent aspect of the invention, a measuring device for measuring the magnetic properties of the surroundings of the measuring device having a sensor line comprising at least one magnetoresistive sensor element extending in one line direction is proposed that can measure the magnetic properties of its surroundings and can generate a magnetic support field in the area that extends over the sensor line with a support field device, as well as with a pre-magnetization device that has a pre-magnetization magnet or multiple pre-magnetization magnets, wherein at least one pre-magnetization magnet is arranged at a distance away from the sensor line in a direction that is vertical with respect to the line direction and that extends in a direction parallel to the line direction. With this measuring device, the sensor line has at least two sensor elements. Each sensor element has at least one signal line that the sensor element uses to emit a sensor signal. Furthermore, at least one multiplexer is provided, to which at least one portion of the signal lines of the sensor elements is routed and that processes the sensor signal of the signal lines routed such that a single signal can be provided to an output signal line of the multiplexer, which was generated based on the sensor signals of the signal lines.

In a preferred embodiment, the measuring device has a signal conditioning and/or signal evaluation mechanism. These signal conditioning and/or signal evaluation mechanisms can be arranged in a microcontroller unit. In a preferred embodiment, a microcontroller unit is provided that uses algorithms to suppress interferences. The algorithm can be designed, in particular, to identify the measurement object or to decrypt codes.

In a preferred embodiment, the measuring device has signal conditioning and/or signal evaluation mechanisms for each signal line and/or for each output line. Each signal line and/or each output line has at least a single-stage amplifier. The preamplifier can be temperature-compensated. The amplification factor of the preamplifier can be adjusted individually. The amplifier can be designed such that only a certain bandwidth is amplified in order to minimize noise and other interfering influences. The bandwidth can also be based, for example, on the speed of the bank notes being transported and the size of the features to be detected. The signals can be emitted directly or can be digitalized in an analog/digital converter and processed in a microcontroller.

In a preferred embodiment, the amplified or non-amplified sensor signals in the signal lines are combined on an output signal line by the multiplexer in chronological order. The output signal line signal is then sent to an A/D converter in amplified or non-amplified form for digitalization and can be processed in a microcontroller unit in amplified or non-amplified form.

The measurement results can then be forwarded to other units for further processing in various formats: The units performing the further processing can form an evaluation of all measured properties—primarily optical but also mechanical and electrical and mechanical properties.

In doing so, the function of the unit performing the further processing can be detected in the measuring device itself either entirely or partially. The unit performing further processing can be designed, for example, as part of the microcontroller unit as well. In this respect, the microcontroller unit can carry out the evaluation.

In a preferred embodiment and as an alternative to the embodiments in which a multiplexer is used, the sensor line can generate an analog signal over each signal line.

In a preferred embodiment and regardless of whether a multiplexer is used or not, the measuring device can generate digital signals according to a protocol, for example according to the protocol of a serial interface or according to the protocol of a USB port.

In a preferred embodiment, the sensor line is encapsulated by a housing. It is particularly preferable that the sensor line be encapsulated by a housing whose surface has contact with the measurement object and enables the least amount of distance with respect to the measurement object and is designed to be wear-resistant. In a preferred embodiment, the sensor line is encapsulated by a housing whose walls, except for the wall that has contact with the measurement object, represent a magnetic shield. In a preferred embodiment, the support field device is integrated into the sensor housing.

In a preferred embodiment, the sensor line can be connected using a connector.

In a preferred embodiment, a portion of the support field device is designed as an element on the individual bridge resistor.

It is particularly preferable that the measuring device according to the invention be used for testing certificates or sheets of paper, particularly bank notes, checks, or other sheets of paper for the presence of magnetic features, particularly to check whether the certificates or sheets have special previously applied magnetic features. A further potential area of application is the testing of ferromagnetic or moved electrically conductive objects for irregularities or material defects.

Figure 2:
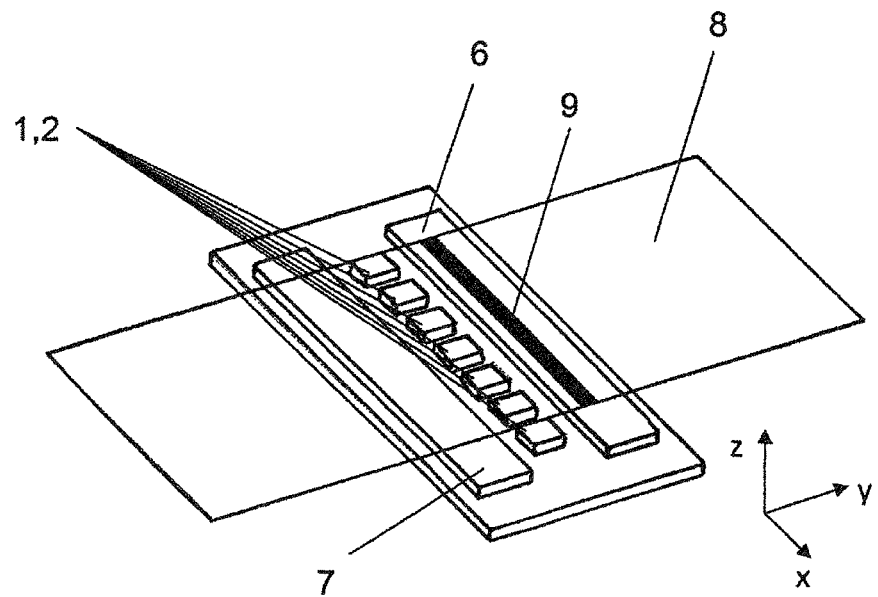
Figure 3:
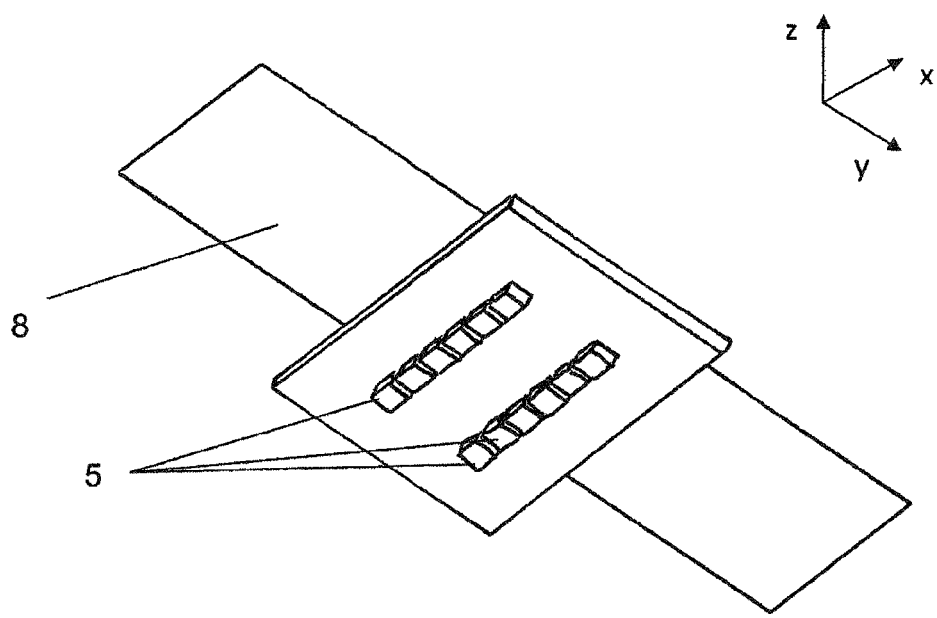
Figure 4:
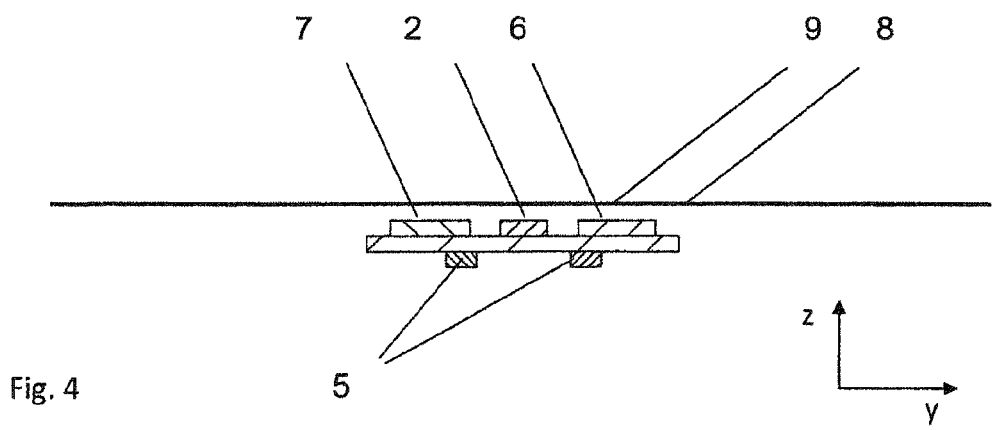
Figure 5:
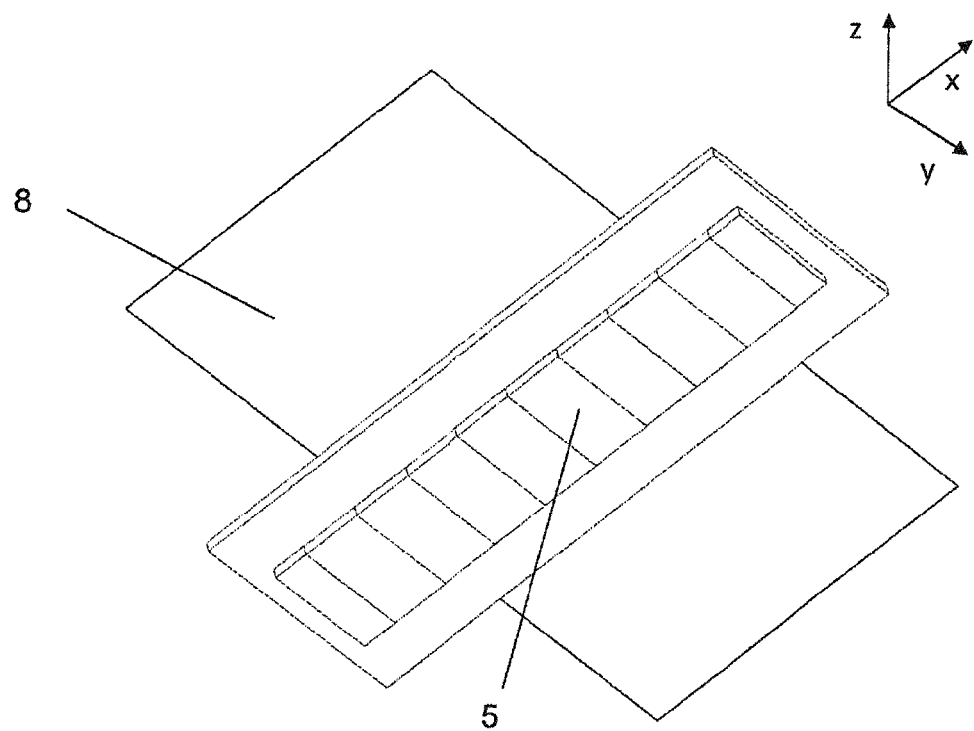
Figure 6:
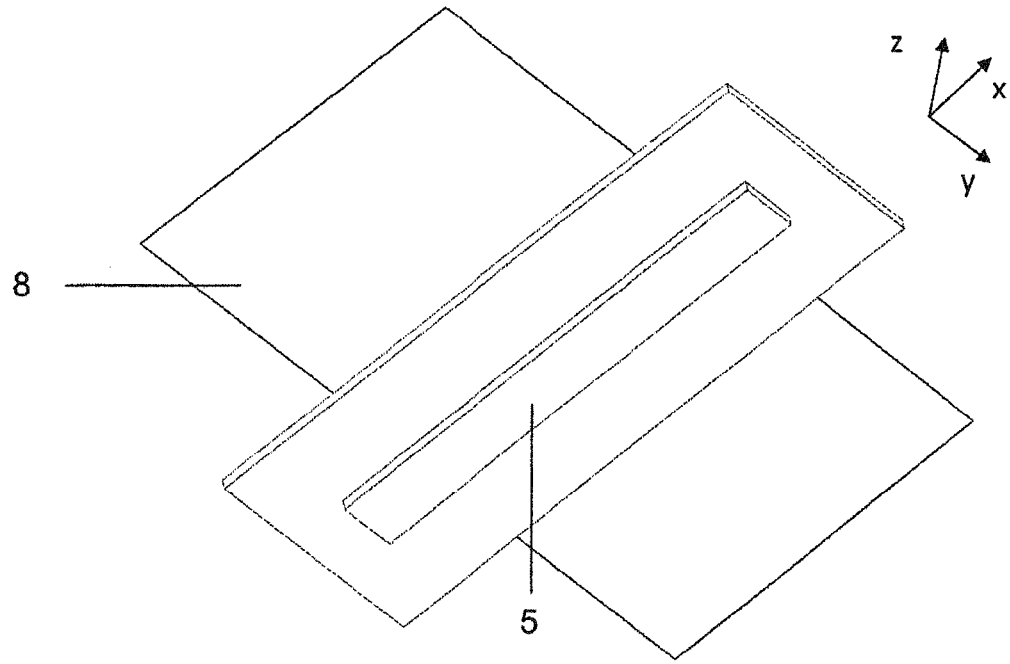
Figure 7:
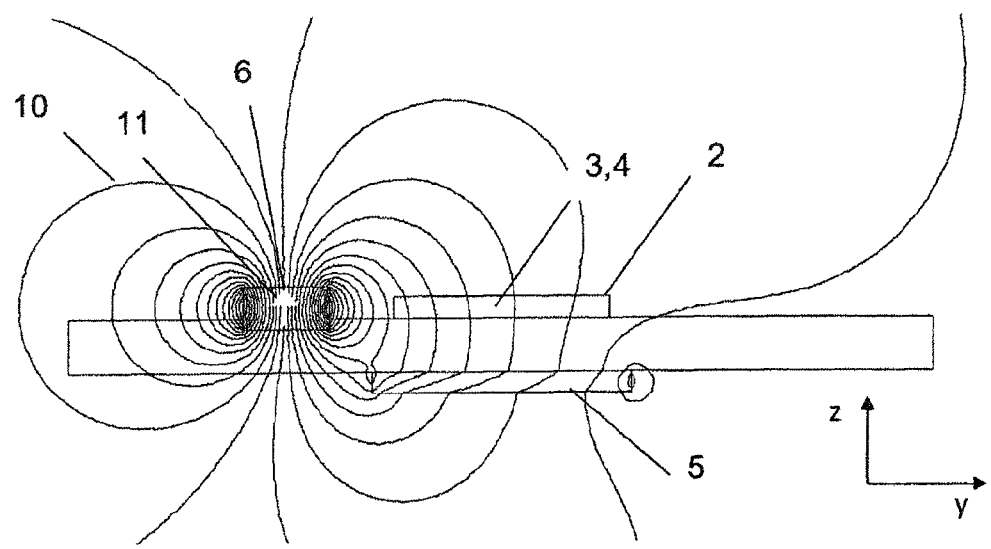
Figure 8:
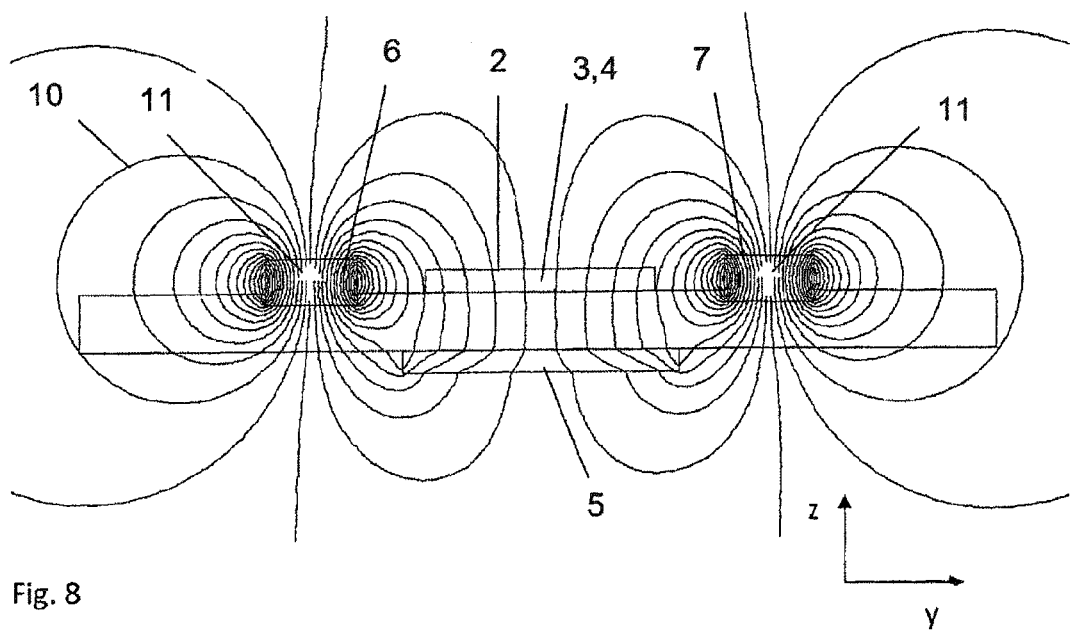
Figure 9:
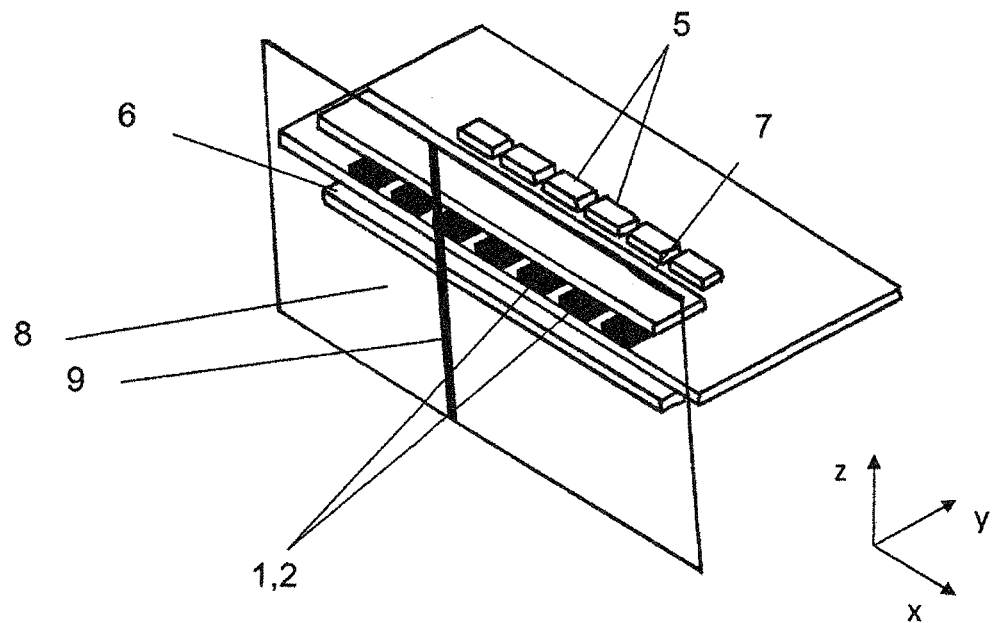
Figure 10:
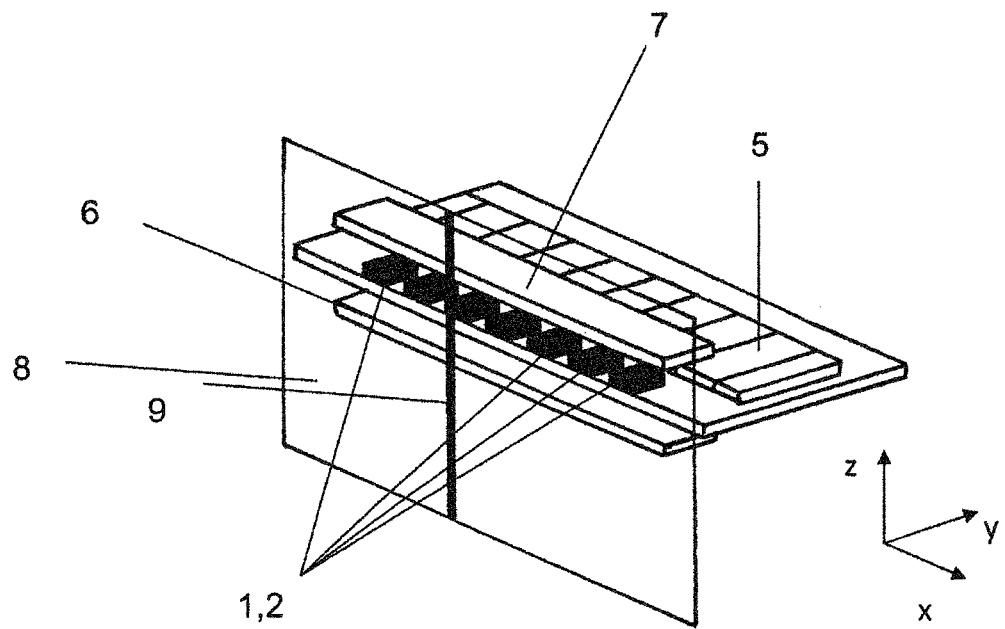
Figure 11:
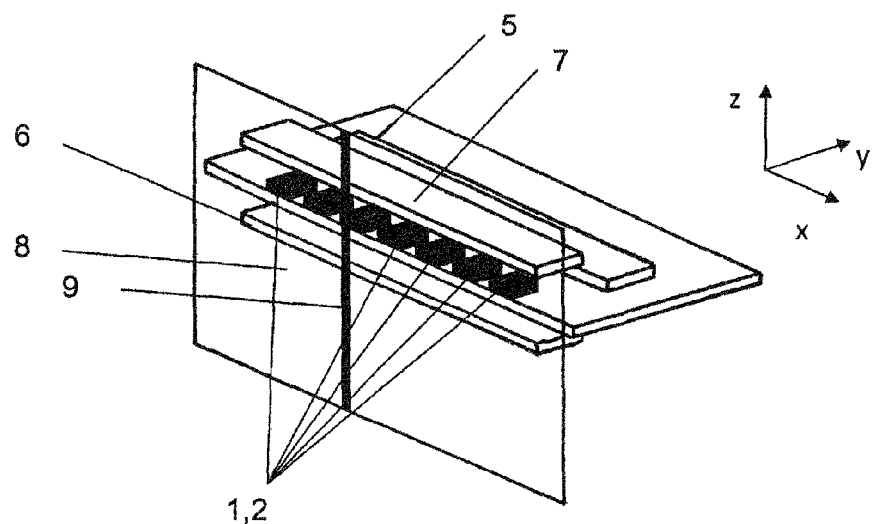
Figure 12:
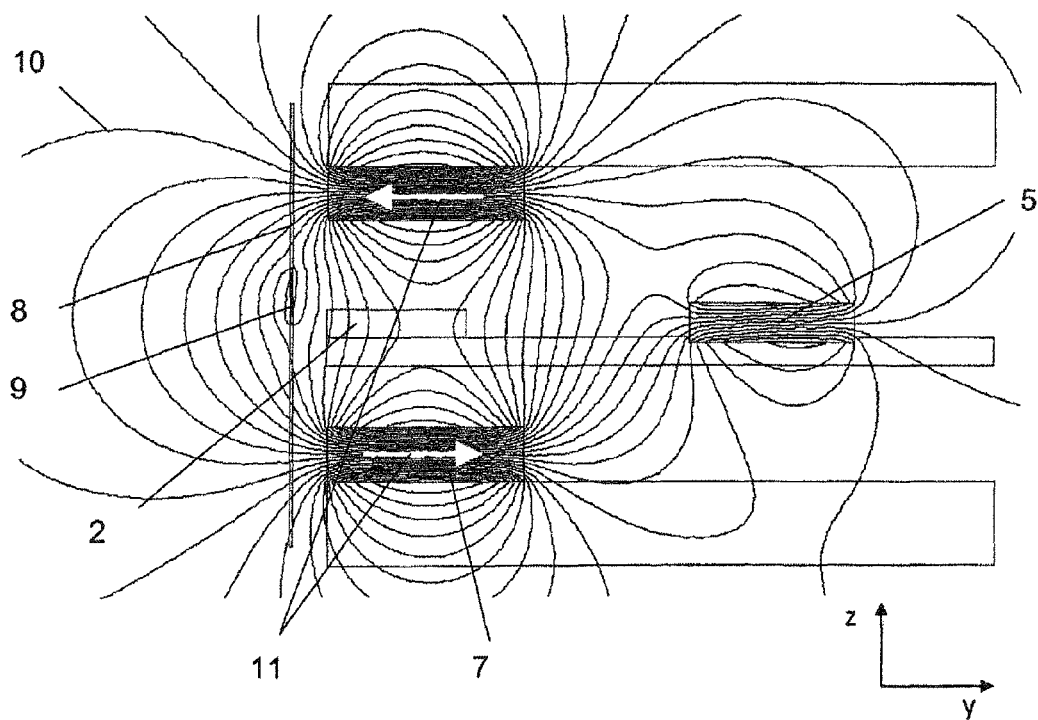
Figure 13:
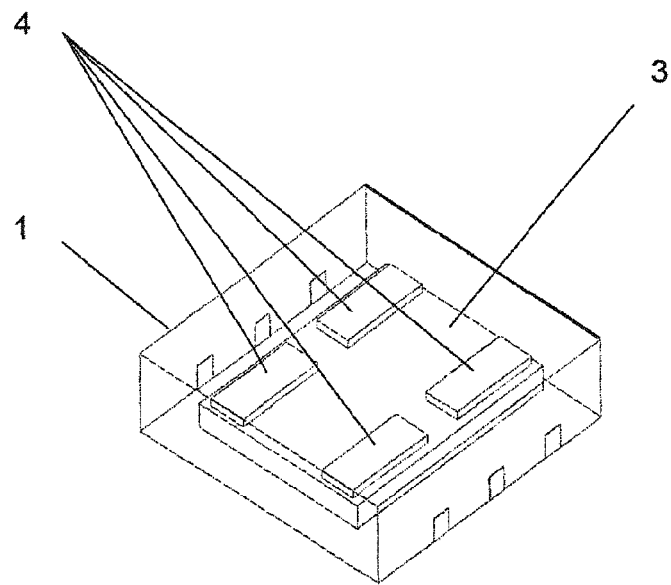
Figure 14:
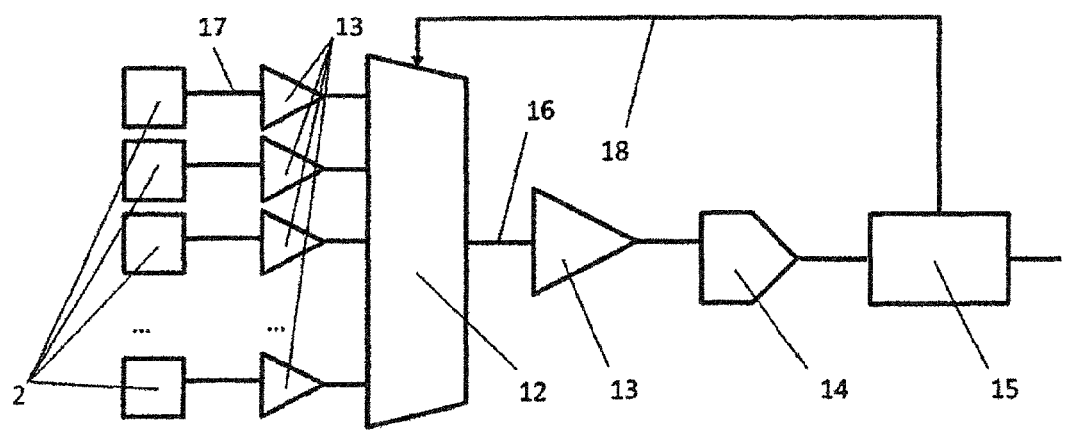
Figure 15:
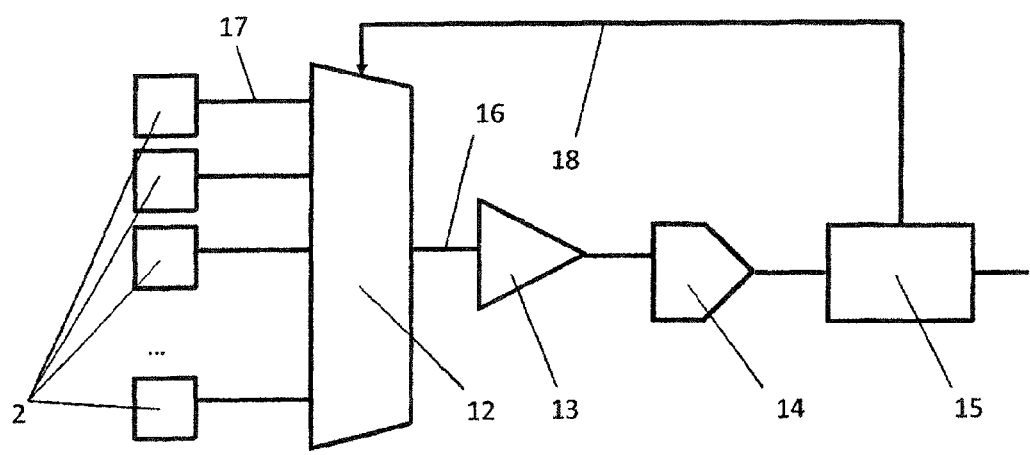
Figure 16:
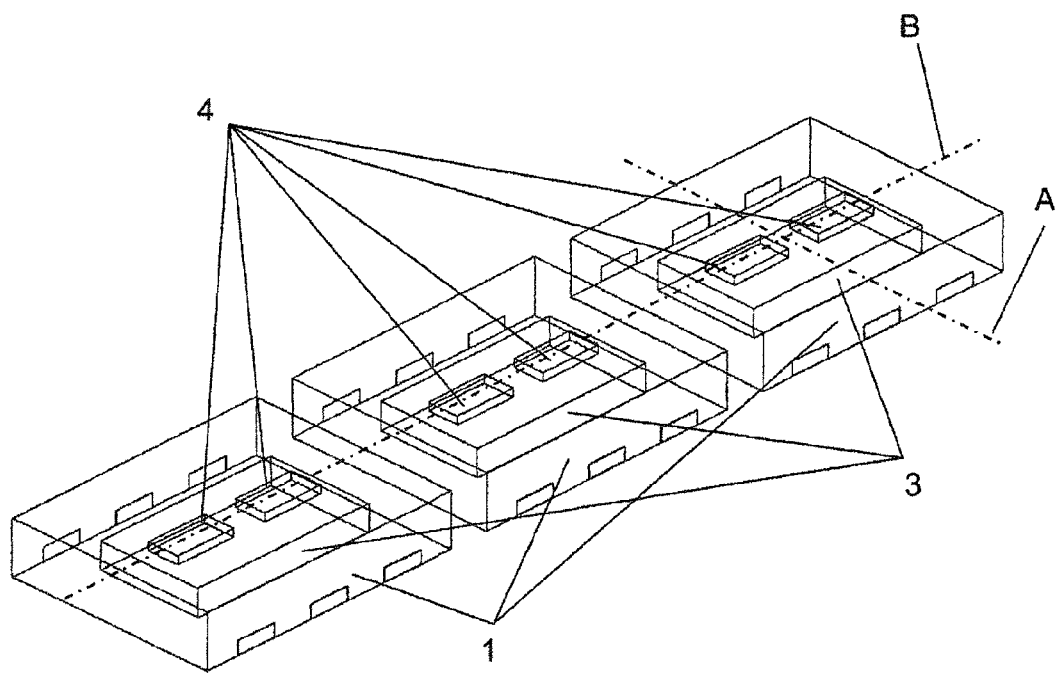
Figure 17A:
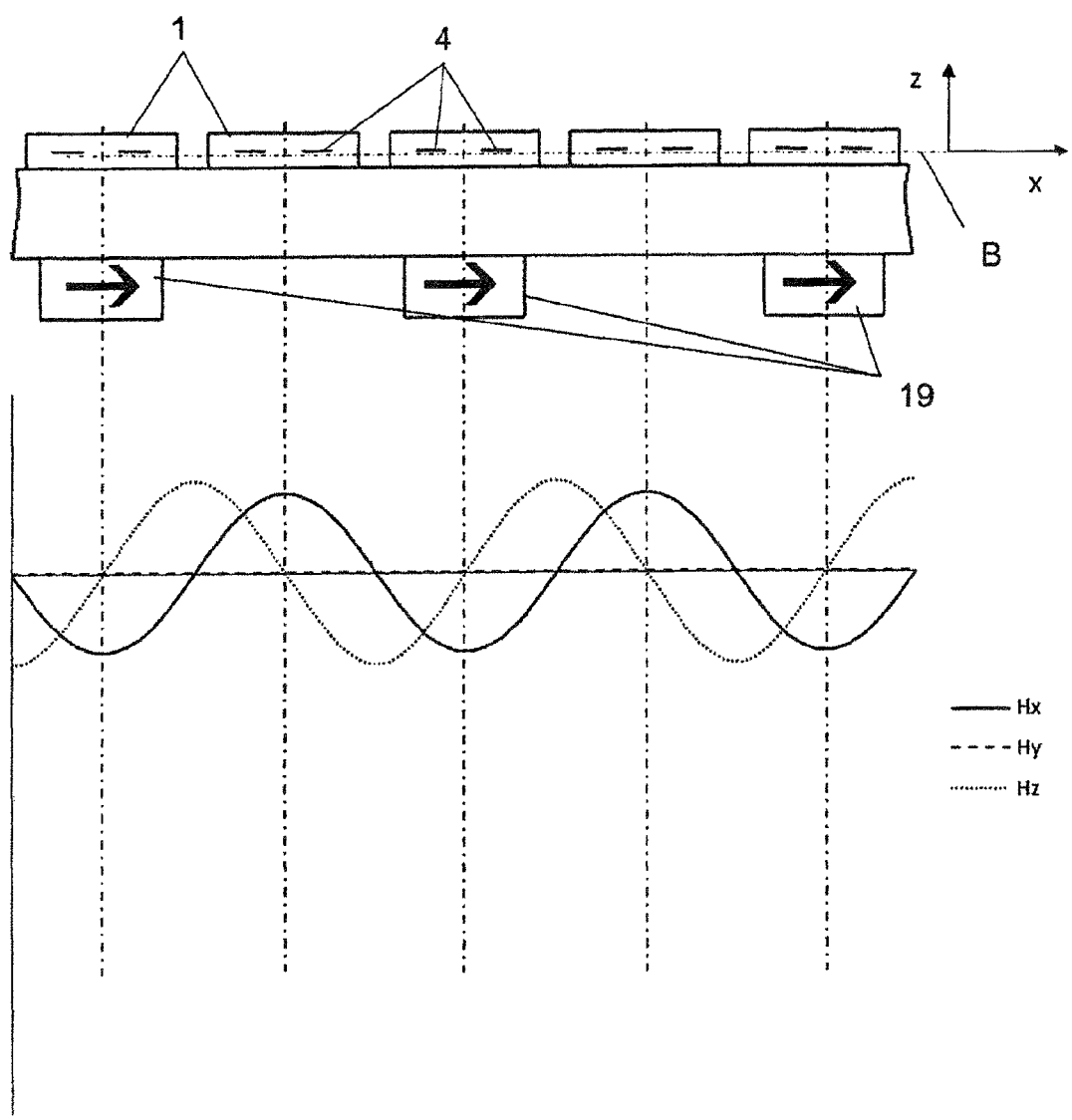
Figure 17B:
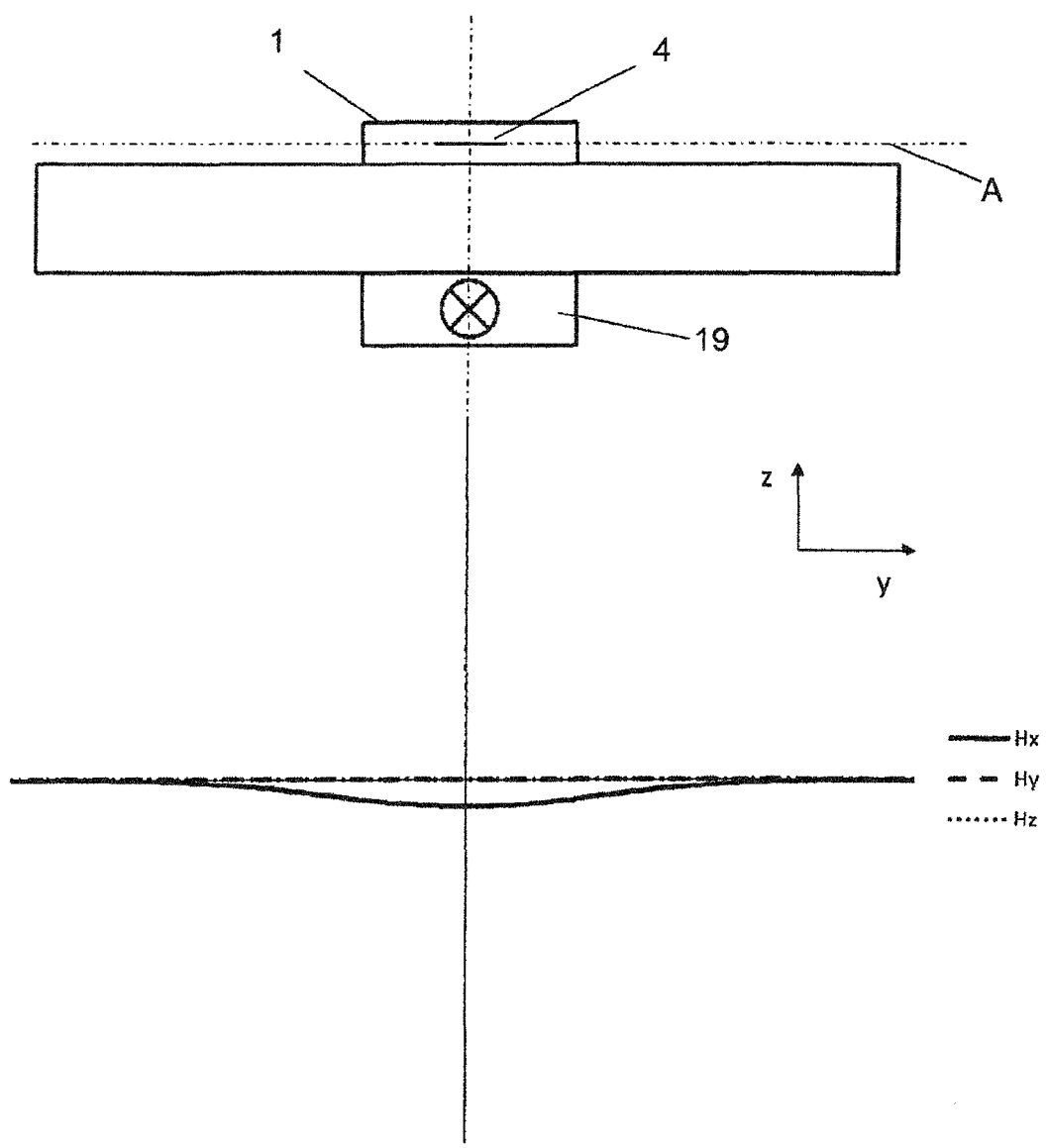
Figure 18A:
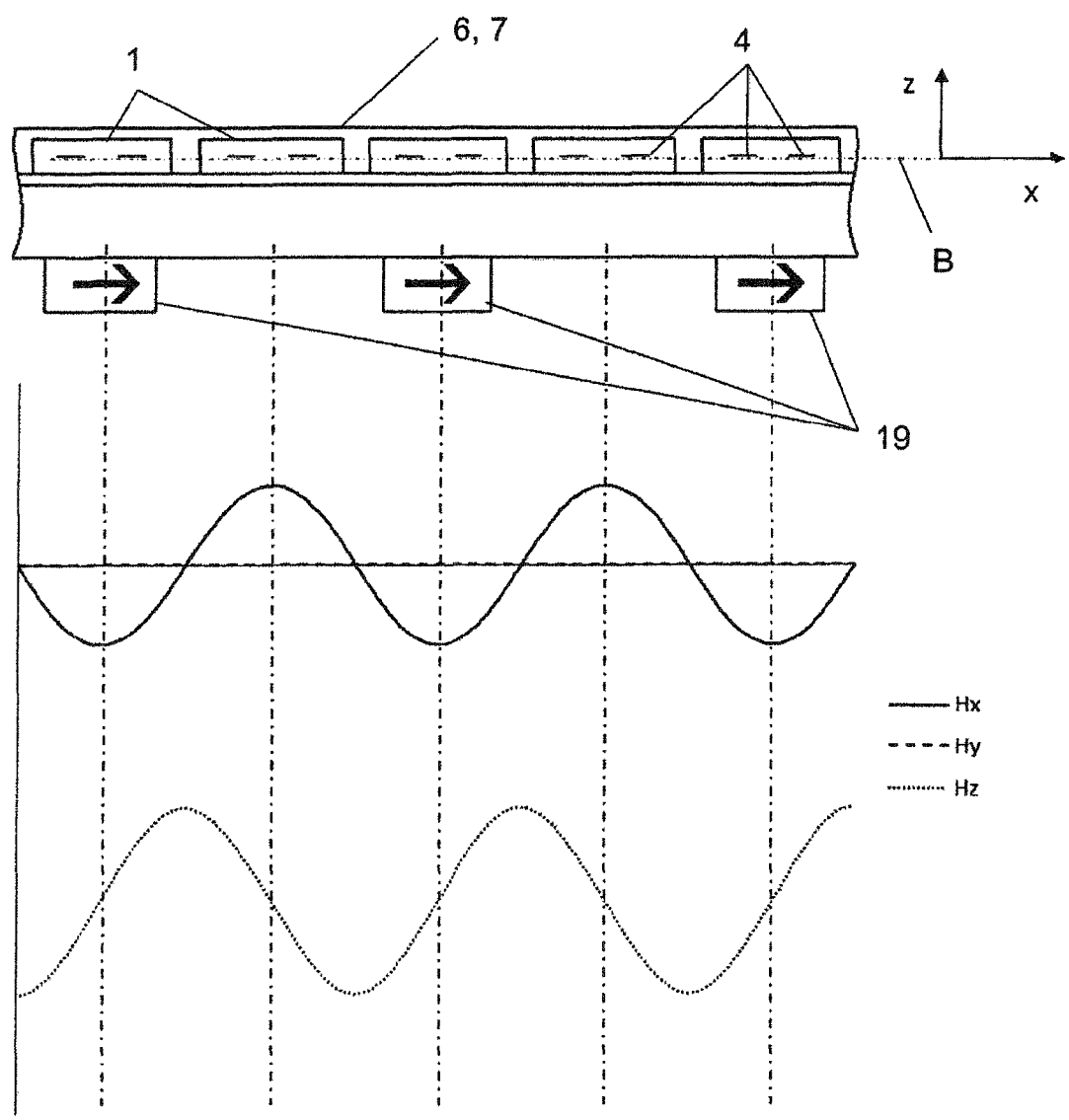
Figure 18B:
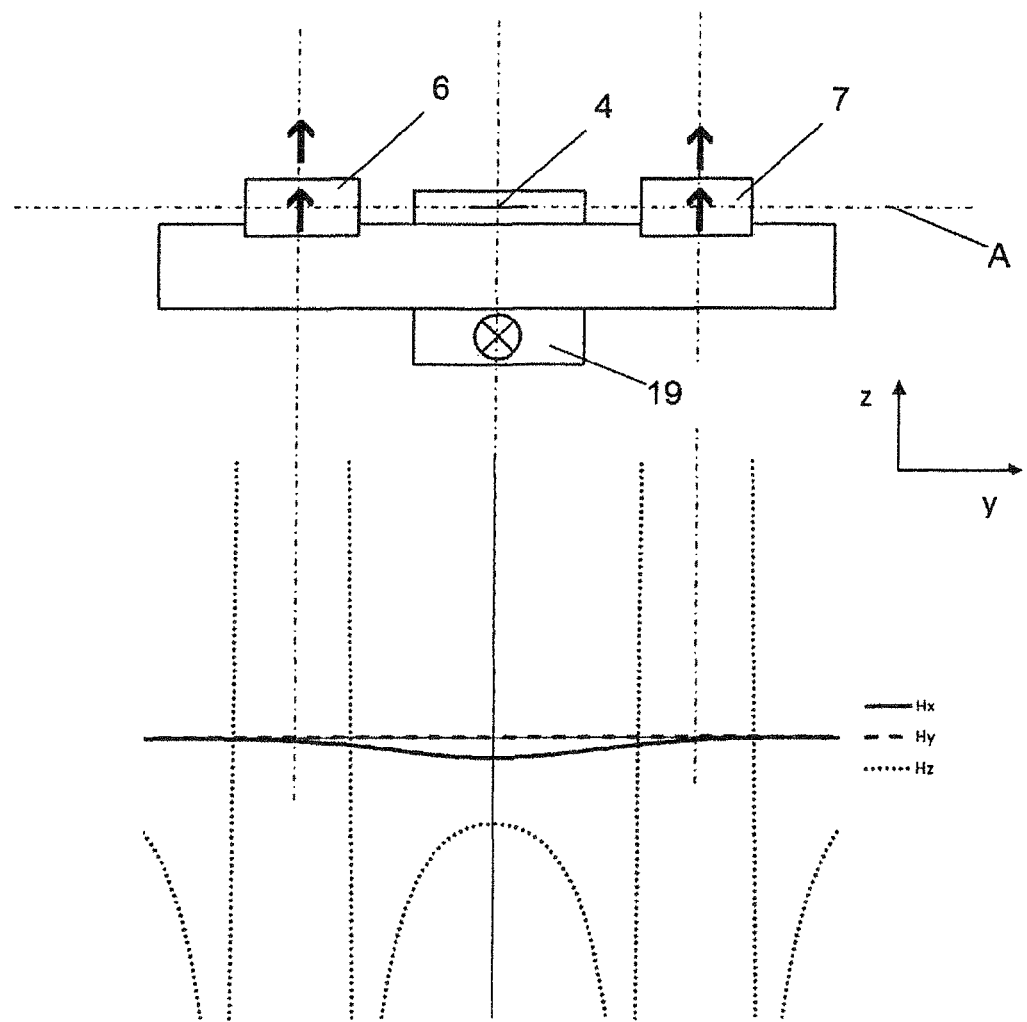

The invention is explained in greater detail in the following using only drawings representing exemplary embodiments of the invention. The following is shown:

FIG. 1: shows a perspective view of a measuring device for measuring the magnetic properties of the surroundings of the measuring device in a schematic representation according to a first embodiment;

FIG. 2: shows a perspective view of a measuring device for measuring the magnetic properties of the surroundings of the measuring device in a schematic representation according to a second embodiment;

FIG. 3: shows a perspective view of the measuring device according to FIG. 2 from below with a first embodiment of a support field device for generating a support field along the sensor line;

FIG. 4: shows a schematic side view of the measuring device according to FIG. 3;

FIG. 5: shows a perspective view of the measuring device according to FIG. 2 from below with a second embodiment of a support field device for generating a support field along the sensor line;

FIG. 6: shows a perspective view of the measuring device according to FIG. 2 from below with a third embodiment of a support field device for generating a support field along the sensor line;

FIG. 7: shows a side view of a measuring device for measuring the magnetic properties of the surroundings of the measuring device in a schematic representation according to the embodiment from FIG. 1 in which the field line pattern of the magnetic field generated by the pre-magnetization magnet is shown;

FIG. 8: shows a side view of a measuring device for measuring the magnetic properties of the surroundings of the measuring device in a schematic representation according to the embodiment from FIG. 2 in which the field line pattern of the magnetic field generated by the pre-magnetization magnet is shown;

FIG. 9: shows a perspective view of a measuring device for measuring the magnetic properties of the surroundings of the measuring device in a schematic representation according to a third embodiment;

FIG. 10: shows a perspective view of a measuring device for measuring the magnetic properties of the surroundings of the measuring device in a schematic representation according to a fourth embodiment;

FIG. 11: shows a perspective view of a measuring device for measuring the magnetic properties of the surroundings of the measuring device in a schematic representation according to a fifth embodiment;

FIG. 12: shows a side view of a measuring device for measuring the magnetic properties of the surroundings of the measuring device in a schematic representation according to the embodiment from FIG. 9, in which the field line pattern of the entire magnetic field affecting a measuring situation in the y-z section being considered is shown;

FIG. 13: shows a perspective view of the principle setup of a sensor element in the measuring device;

FIG. 14: shows a schematic embodiment of signal processing using a multiplexer, multiple amplifiers, an analog/digital converter, and a microcontroller unit;

FIG. 15: shows a schematic embodiment of signal processing using a multiplexer, one amplifier, an analog/digital converter, and a microcontroller unit;

FIG. 16: shows a portion of the measuring device according to the invention in a schematic representation in one view;

FIG. 17: shows a setup of a support field device of a measuring device according to the invention in which a support field is generated in a schematic representation in a transverse view (upper area of FIG. 17a) and longitudinal view (upper area of FIG. 17b) and the corresponding field distributions along the x-axis (lower area of FIG. 17a) and along the y-axis (lower area of FIG. 17b);

FIG. 18: shows a setup of a support field device and a pre-magnetization device of a measuring device according to the invention in which a support field locally limited to the sensor element is generated in a schematic representation in a transverse view (upper area of FIG. 18a) and longitudinal view (upper area of FIG. 18b) and the corresponding field distributions along the x-axis (lower area of FIG. 18a) and along the y-axis (lower area of FIG. 18b);

FIGS. 1 to 12 show embodiments of measuring devices for measuring magnetic properties of the surroundings of the measuring device, namely a measuring device for testing certificates or sheets, particularly bank notes, checks, or other paper documents for the presence of magnetic features, particularly to check whether the certificates or sheets have special, previously applied magnetic features.

The measuring devices shown in FIGS. 1 to 12 each has a sensor line 2, consisting of sensor elements 1. As can be seen in FIG. 13, a sensor element 1 on a substrate 3 has magnetoresistive bridge resistors 4 that are connected to form a Wheatstone bridge. If external resistors are used, one bridge resistor 4 can be used per sensor element 1. The sensor elements 1 may be combined into groups, i.e. into so-called sensors. The bridge resistors 4 have the AMR effect. Using this bridge circuit, the sensor element 1 can measure magnetic properties of its surroundings, particularly the change in the field strength of a field component. The sensor lines shown in FIGS. 1 to 12 have seven sensor elements 1 arranged next to one another in the line direction.

A Wheatstone bridge in this case in the most general terms can also be understood to be an arrangement with voltage dividers whose individual potentials may be evaluated between one another and relative to a reference half-bridge voltage.

The measuring devices shown in FIGS. 1 to 12 each has a support field device 5 that extends in the area in which the sensor line 2 generates a magnetic support field.

FIGS. 1 to 12 further show a document of value 8 with a security feature 9.

Furthermore, the measuring devices shown in FIGS. 1 to 12 each has a pre-magnetization device. With the embodiment shown in FIGS. 1 and 7, the pre-magnetization device has a pre-magnetization magnet 6 that is arranged a distance away from the sensor line 2 in a direction that is vertical with respect to the line direction and that extends in a direction that is parallel to the line direction. The embodiments shown in FIGS. 2 to 6 and 8 to 12 have pre-magnetization devices that have a first pre-magnetization magnet 6 that is arranged a distance away from the sensor line 2 in a direction that is vertical with respect to the line direction and that extends in a direction that is parallel to the line direction. Furthermore, the embodiments shown in FIGS. 2 to 6 and 8 to 12 have pre-magnetization devices with a second pre-magnetization magnet 7 that is arranged a distance away from the sensor line 2 in a direction that is opposite the direction in which the first pre-magnetization magnet 6 is arranged some distance from the sensor line 2.

The magnetoresistive sensor element 1 measures the magnetic properties of its surroundings in the plane spanned by measuring direction x and measuring direction y of the orthogonal coordinate system shown in the figures, namely the change in the field strength of the field component, pointing in measuring direction y, of the magnetic field affecting sensor element 1. The magnetoresistive sensor element cannot measure the magnetic properties of its surroundings in direction x and direction z of the orthogonal coordinate system shown in FIGS. 1 to 12.

The pre-magnetization magnet 6 shown in FIG. 1 of the pre-magnetization device does not generate a magnetic field, in the direction of direction x and in direction y, at any point of sensor line 2, a magnetic field whose field strength in direction x or measuring direction y is greater than the field strength of the magnetic field generated by the support field device 5 in direction x or measuring direction y. It is preferable that the output of the support field device 5 and the pre-magnetization device be as close to zero as possible for the component active in measuring direction y. This is potentially determined by the arrangement of the pre-magnetization magnet 6 relative to the sensor line 2, as well as the shape of the pre-magnetization magnet that extends in line direction B (x direction, also compare to FIG. 16) along the entire sensor line 2. This type of pre-magnetization magnet 6 generates a magnetic field, at each point in the sensor line 2, which essentially points in the z direction, i.e. in the negative z direction, having a field strength, while the field strength of this field is practically 0 in the y direction or in the x direction.

FIGS. 7, 8, and 12 show the magnetization direction of the magnet in the pre-magnetization magnet by an arrow 11, wherein the arrow represents the magnetization direction from the south pole to the north pole in the respective element.

The pre-magnetization device in FIGS. 2 to 6 and 8 has a first pre-magnetization magnet 6 and a second pre-magnetization magnet 7. Due to the arrangement and the geometric extension of the pre-magnetization magnets, 6 and 7, the field generated by the overlapping of the individually generated magnetic fields generated by the pre-magnetization magnets 6, 7 has, at each point of the sensor line 2, a direction that essentially points in the negative z direction. Thus, the field generated by the overlapping does not have a significant field strength pointing in the x direction or y direction at any point on the sensor line.

In the embodiment of FIGS. 9, 10, and 11, the pre-magnetization magnets, 6 and 7, are arranged such that the resulting field component amounts at the site at the sensor elements extend vertically with respect thereto, i.e. in the direction of the height of the sensor element. In addition to the resulting field components of pre-magnetization magnets 6 and 7, the field components affect the support field device 5.

With the embodiment shown in FIGS. 1 and 7, the properties, influencing the magnetic field generated by it, of the pre-magnetization magnet 6 and its arrangement relative to the sensor line 2 as well as the support field generated by the support field device 5 are selected such that an overlapping magnetic field results from the overlapping of the magnetic field and the support field generated by the pre-magnetization device, whose strength in the field component pointing in the line direction (x direction in the coordinate system) is greater, at all locations along sensor line 2, than the strength of the field component pointing vertically toward the line direction in the direction of the y direction of the coordinate system and thus not in the direction of the height of the sensor element (in the z direction of the coordinate system).

With the embodiments shown in FIGS. 2 to 6 and 8 to 12, the properties, influencing the magnetic field generated by them, of the pre-magnetization magnets and the arrangement of the pre-magnetization magnets relative to the sensor line as well as the support field generated by the support field device are selected such that an overlapping magnetic field results from the overlapping of the magnetic field and the support field generated by the pre-magnetization device, whose strength in the field component pointing in the line direction (x direction in the coordinate system) is greater, at all locations along sensor line 2, than the strength of the field component pointing vertically toward the line direction in the direction of the y direction of the coordinate system and thus not in the direction of the height of the sensor element (in the z direction of the coordinate system).

With the support field device shown in FIG. 3, the support field device is formed by an arrangement of permanent individual magnets. In the support field device shown in FIG. 5, the support field device is formed by a pole strip. In the support field device shown in FIG. 6, the support field device is formed by a single magnet.

FIGS. 1 to 6 and 9 to 12 show a bank note 8 with a magnetic security feature 9. The bank note is moved vertically with respect to the line direction past the measuring device (in the negative y direction in FIGS. 1 to 8 and in the negative z direction in FIGS. 9 to 12). In doing so, it is initially moved past the pre-magnetization magnet 6 that initially fully magnetizes the hard magnetic material. Subsequently, the bank note 8 and the hard magnetic material 9 are moved further. The now magnetized hard magnetic material generates a magnetic field in its surroundings. This magnetic field overlaps in the area of the sensor elements 1 of sensor line 2 with the magnetic field generated by the support field device 5 and the magnetic field generated by the pre-magnetization device in the sensor line. This overlapping of the magnetic field generated by the hard magnetic material onto the permanent magnetic fields of the support field device and the pre-magnetization device causes a change in the magnetic field in the sensor elements 1 of the sensor line 2, which can be determined by the magnetoresistive sensor elements 1. In this manner, the measuring device can determine the presence of the hard magnetic structure 9 on the bank note 8. If the bank note 8 additionally has soft magnetic structures, these soft magnetic structures are completely saturated, in the ideal case, by the magnetic field of the pre-magnetization magnet/pre-magnetization magnets, particularly in the area of the measuring device if the soft magnetic structure is located close to the sensor line 2. The magnetic field generated by the saturated, soft magnetic structure then additionally overlaps with the magnetic field generated by the hard magnetic material and the permanent magnetic fields of the support device and the pre-magnetization device, thereby resulting in a change in the magnetic field and the sensor elements 1 of the sensor line 2, which can be determined by the magnetoresistive sensor elements 1.

FIG. 14 shows a schematic embodiment of signal processing. Each sensor element 2 provides a sensor signal that is provided, via a signal line 17, to an amplifier 13 whose output signal is generated to a multiplexer 12. The amplified sensor signals are combined by the multiplexer 12 on one output signal line 16 in chronological order. The output signal line signal is then sent, in a second amplifier stage 13, to an A/D converter 14, in amplified or non-amplified form, for digitalization and processed in a microcontroller unit 15. The microcontroller unit 15 controls the multiplexer 12 via a control line 18.

FIG. 15 shows another embodiment of signal processing. Each sensor signal of a sensor element 2 is provided to a multiplexer 12, in non-amplified form, via a signal line 17. The non-amplified sensor signals are combined by the multiplexer 12 on one output signal line 16 in chronological order. The output signal line signal is then sent, in an amplifier stage 13, to an A/D converter 14, in amplified form, for digitalization and processed in a microcontroller unit 15. The microcontroller unit 15 controls the multiplexer 12 via a control line 18.

FIG. 16 shows the sensor elements that are arranged along the x axis. Line B extends parallel to the x axis and through the sensor measuring plane. Line A extends vertical to line B along the y direction through the sensor measuring plane.

The length of the sensor line and thus the line of the magnetoresistive sensor elements 1 depends on the measurement to be taken. In particular, the number of sensor elements 1 used depends on the measuring task, i.e. essentially on the width of the object to be measured. To measure euro bank notes, a sensor line may have, for example, more than 10, or particularly preferably more than 20, and primarily 28 sensor elements 1, with more than 100 sensor elements 1, for example 168 being particularly preferred.

The pattern of magnetic field components for a measuring device will now be shown using FIGS. 17 and 18. FIGS. 17 and 18 show a possible design of a support field device 5 as is also reflected, for example, in FIG. 8. The support field device 5 can be used to generate a magnetic field that has a magnetic field component pointing in the line direction and whose field strength in the sensor line 2 varies in the line direction.

FIG. 18 shows a preferred embodiment of a sensor line 2 in which the support field device 5 shown in FIG. 17 is used together with a pre-magnetization device having pre-magnetization magnets, 6 and 7.

The upper area of FIG. 17a shows sensor elements 1 arranged along line B that form a section of a sensor line 2, which extends from left to right. The upper area of FIG. 17b shows the corresponding longitudinal section matching the upper area of FIG. 17a.

The support field device 5 in FIG. 17 has a plurality of (support field) magnets 19 that are arranged underneath the sensor elements 1. This means that the measurement object, for example the document of value 8, is moved above the sensor line shown in FIG. 17, and the magnets 19 of the support field device are allocated to the opposite side, i.e. underneath the sensor line. The sensor elements 1 have at least one bridge resistor 4.

In the support field device 5 shown in FIG. 17, the magnets 19 are aligned in the same way. The respective north pole of the magnets 19 points to the right, which is indicated by the arrows in the respective magnets 19.

The magnetic field distribution generated by the arrangement of the support field magnets 19 is shown in the lower areas of FIGS. 17a and 17b.

The lower area of FIG. 17a shows the two field components of the support field device 5 along the x and z directions, which point in a sinusoidal, phase-shifted pattern. The field component of the support field device 5 is zero in the z direction.

FIG. 17b shows the field distribution for the support field device 5 and the longitudinal section along line A. The support field component Hx shows a dependency along the y direction while the two other components are zero.

FIG. 18 shows the support field device 5 shown in FIG. 17 but it has been supplemented to include the pre-magnetization device as it is described in FIGS. 1 to 8, and can have pre-magnetization magnets 6 and 7. The upper area of FIG. 18a shows the cross-section. The two pre-magnetization magnets 6, 7 are arranged symmetrically to the left and right of the sensor element 1 (see also FIG. 18b). The support field magnets 19 are arranged underneath the sensor element 1.

The lower area of FIG. 18a shows schematically the corresponding distribution of the field components. The distribution of the Hx and Hy components of the overlapping field comprising the magnetic field of the support field device 5 and the magnetic field of the pre-magnetization device essentially corresponds to the distribution of the Hx and Hy components of the magnetic field of the support field device 5 alone, while the Hz component of the support field device is overlapped by the output from the pre-magnetization magnets 6, 7. The influence of the Hx and Hy components of the overlapping field is slight or there is approximately no influence.

The upper area of FIG. 18b shows the corresponding longitudinal section for FIG. 18a. The lower area of FIG. 18b shows the overlapping field. Field component Hz of the overlapping field exhibits a complex pattern along line A. The value is very large (positive) above the pre-magnetization magnets 6, 7. There is a large negative value above the sensor element 1. The pattern of the field component in the x direction is essentially not influenced by the additional field output of the pre-magnetization magnets 6, 7 and is almost the same as that in FIG. 17a.

FIGS. 17 and 18 show that the field strength pattern in line direction B in the area of the edges of the sensor elements 9 does not have a zero-crossing or a maximum or minimum. With the embodiment shown in FIGS. 17 and 18, the field strength pattern has a maximum and/or a minimum in the center of a sensor element 1 and a zero-crossing between two sensor elements 1.

The pattern of the magnetic field components for the arrangement of FIGS. 17 and 18 enable statements to be made regarding a measuring device having a pre-magnetization magnet 6 as shown in FIG. 1. The pre-magnetization magnet 6 shown in FIG. 1 generates a magnetic field, at each point in the sensor line 2, which essentially points in the z direction, i.e. in the negative z direction, having a field strength, while the field strength of this field is practically 0 in the y direction or in the x direction. If the setup of the pre-magnetization device shown in FIG. 1 is combined with a support field device as has been described in connection with FIGS. 17 and 18, it is clear that the support field device 5 generates a magnetic field in which the field strength of the field component pointing in the x direction (in the line direction) fluctuates between a positive maximum value and a negative maximum value. In the points at which, even with the support field device 5, the field component pointing in the line direction (x direction) assumes the value 0, the value of the field component pointing in the line direction corresponds to the value of the corresponding field component of the pre-magnetization device pointing in the line direction—namely, both components will assume the value of 0. However, the pattern shown in FIGS. 17 and 18 indicates that the field component generated by the support field device 5 also has values greater than and less than 0 in the line direction. The field strength of the field component, pointing in the line direction, of the overlapping magnetic field thus corresponds to the field strength of the field component generated by the support field device in this direction. The output of the field generated by the pre-magnetization device in this direction is 0. Likewise, the output of the field strength, pointing in the y direction, of the pre-magnetization device in this direction is 0.

The invention claimed is:

1. A measuring device for measuring magnetic properties of surroundings of the measuring device having a sensor line comprising at least one magnetoresistive sensor element extending in a line direction and configured to measure magnetic properties in its surroundings, wherein the sensor element has a width and a length as well as a height, wherein the height is less than the width and the height is less than the length, and the line direction points in a direction of the width or in a direction of the length of the sensor element and, with a support field device, which generates a magnetic support field in an area over which the sensor line extends, and with a pre-magnetization device having a pre-magnetization magnet or multiple pre-magnetization magnets, wherein at least one pre-magnetization magnet is arranged at a distance away from the sensor line in a direction that is vertical to the line direction and that extends in a direction parallel to the line direction, wherein:

the magnetoresistive sensor element essentially only measures the magnetic properties of the magnetoresistive sensor element's surroundings in one direction, characterized as a measuring direction, of an orthogonal coordinate system or in one plane, characterized as a sensor measuring plane, spanned by two vertical measuring directions of an orthogonal coordinate system;

with a pre-magnetization device only composed of one pre-magnetization magnet, that properties, influencing a magnetic field generated by it, of the pre-magnetization magnet and its arrangement relative to the sensor line, as well as the support field generated by the support field device are selected such that an overlapping magnetic field results from overlapping of the support field and the magnetic field generated by the pre-magnetization device, wherein the overlapping magnetic field's strength in the field component pointing in the line direction is greater, at least at one location on the sensor line, than the strength of a field component pointing vertically toward the line direction; or with a pre-magnetization device composed of multiple pre-magnetization magnets, that properties, influencing the magnetic field generated by the pre-magnetization magnets and the arrangement of the pre-magnetization magnets relative to the sensor line, as well as the support field generated by the support field device are selected such that an overlapping magnetic field results from an overlapping of the support field and the magnetic field generated by the pre-magnetization device whose strength of the field component pointing in the line direction is greater, at least at one location on the sensor line, than the strength of a field component pointing vertically toward the line direction.

2. The measuring device according to claim 1, wherein the pre-magnetization device has multiple pre-magnetization magnets comprising a first pre-magnetization magnet and a second pre-magnetization magnet, wherein the second pre-magnetization magnet is arranged at a distance away from the sensor line in a direction that is opposite the direction in which the first pre-magnetization magnet is arranged at a distance away from the sensor line.

3. The measuring device according to claim 1, wherein the sensor line and the support field device are arranged on a printed circuit board.

4. The measuring device according to claim 1, wherein the sensor line, the support field device, and at least one pre-magnetization magnet of the pre-magnetization device are arranged on a printed circuit board.

5. The measuring device according claim 1, wherein the support field device has a permanent magnetic layer in which the thickness pointing in a direction vertical with respect to the line direction is less than a width in a second direction vertical with respect to the line direction.

6. The measuring device according to claim 5, wherein the support field device has periodic magnetization.

7. The measuring device according to claim 1, wherein the support field device has an arrangement of permanent magnets that have a common magnetization direction or that the support field device has an arrangement of permanent magnets that have an alternating direction of magnetization.

8. The measuring device according to claim 1, wherein the sensor line has at least two sensor elements, that each sensor element has at least one signal line, via which the sensor element emits a sensor signal, and at least one multiplexer is provided to which at least a portion of the signal lines of the sensor elements is routed and that processes the sensor signals of the signal lines routed to it, directly or preamplified, such that a single signal is provided to an output signal line of the multiplexer, which was generated based on the sensor signals of the signal lines.

9. A measuring device for measuring magnetic properties of surroundings of the measuring device having a sensor line comprising at least one magnetoresistive sensor element extending in a line direction and configured to measure magnetic properties in its surroundings, wherein the sensor element has a width and a length as well as a height, wherein the height is less than the width and the height is less than the length, and the line direction points in a direction of the width or in a direction of the length of the sensor element and, with a support field device, which generates a magnetic support field in an area over which the sensor line extends, and with a pre-magnetization device having a pre-magnetization magnet or multiple pre-magnetization magnets, wherein at least one pre-magnetization magnet is arranged at a distance away from the sensor line in a direction that is vertical to the line direction and that extends in a direction parallel to the line direction, wherein:

the magnetoresistive sensor element essentially only measures the magnetic properties of the magnetoresistive sensor element's surroundings in one direction, characterized as a measuring direction, of an orthogonal coordinate system or in one plane, characterized as a sensor measuring plane, spanned by two vertical measuring directions of an orthogonal coordinate system;

with a pre-magnetization device composed of multiple pre-magnetization magnets, that properties, influencing the magnetic field generated by the pre-magnetization magnets and the arrangement of the pre-magnetization magnets relative to the sensor line, as well as the support field generated by the support field device are selected such that an overlapping magnetic field results from an overlapping of the support field and the magnetic field generated by the pre-magnetization device whose strength of the field component pointing in the line direction is greater, at least at one location on the sensor line, than the strength of a field component pointing vertically toward the line direction, and wherein the multiple pre-magnetization magnets comprise a first pre-magnetization magnet and a second pre-magnetization magnet, wherein the second pre-magnetization magnet is arranged at a distance away from the sensor line in a direction that is opposite the direction in which the first pre-magnetization magnet is arranged at a distance away from the sensor line.

10. A measuring device for measuring magnetic properties comprising:

a sensor line comprising at least one magnetoresistive sensor element extending along a sensor line axis;

a support field device configured to generate a magnetic support field extending over at least a portion of the sensor line; and a pre-magnetization device, having at least one pre-magnetization magnet, arranged at a distance from the sensor line in a direction that is generally perpendicular to the sensor line axis, and extending parallel to the sensor line axis, wherein the sensor line, the support field device and the pre-magnetization device are configured such that an overlapping magnetic field results from the support field and a magnetic field generated by the pre-magnetization device, the overlapping magnetic field having a strength in a field component parallel to the sensor line axis greater, at least at one location on the sensor line, than a strength of a field component perpendicular to the sensor line axis.

11. The measuring device according to claim 10, wherein the pre-magnetization device has a first pre-magnetization magnet and a second pre-magnetization magnet, wherein the second pre-magnetization magnet is arranged at a distance from the sensor line in a direction that is opposite the direction in which the first pre-magnetization magnet is arranged at a distance from the sensor line.

12. The measuring device according to claim 10, wherein the sensor line and the support field device are arranged on a printed circuit board.

13. The measuring device according to claim 12, wherein the at least one pre-magnetization magnet of the pre-magnetization device is arranged on the printed circuit board.

* * * * *